United States Patent
Suzuki et al.

(10) Patent No.: US 11,841,614 B2
(45) Date of Patent: Dec. 12, 2023

(54) EXPOSURE APPARATUS, EXPOSURE METHOD, AND ARTICLE MANUFACTURING METHOD

(71) Applicant: CANON KABUSHIKI KAISHA, Tokyo (JP)

(72) Inventors: Kanji Suzuki, Saitama (JP); Manabu Hakko, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 17/336,022

(22) Filed: Jun. 1, 2021

(65) Prior Publication Data

US 2021/0382397 A1 Dec. 9, 2021

(30) Foreign Application Priority Data

Jun. 4, 2020 (JP) .................. 2020-097739

(51) Int. Cl.
| | |
|---|---|
| G03F 7/20 | (2006.01) |
| G03F 7/00 | (2006.01) |
| G02B 19/00 | (2006.01) |
| G02B 27/09 | (2006.01) |

(52) U.S. Cl.
CPC ..... *G03F 7/70091* (2013.01); *G02B 19/0033* (2013.01); *G02B 27/0927* (2013.01); *G02B 27/0955* (2013.01)

(58) Field of Classification Search
CPC ............ G03F 7/70091; G03F 7/70575; G03F 7/7005; G03F 7/7015; G03F 7/70258; G03F 7/70075; G02B 19/0033; G02B 27/0927; G02B 27/0955; G02B 5/005; G02B 19/0066; H01L 21/027
See application file for complete search history.

(56) References Cited

U.S. PATENT DOCUMENTS

| | | | | |
|---|---|---|---|---|
| 2007/0211231 A1* | 9/2007 | Suda | .................. | G03F 7/70108 355/2 |
| 2009/0040497 A1* | 2/2009 | Kawakami | .......... | G03F 7/70191 355/71 |
| 2010/0220306 A1* | 9/2010 | Malach | ............... | G03F 7/70075 250/553 |
| 2018/0128458 A1* | 5/2018 | Fukasawa | ................. | F21K 9/64 |

FOREIGN PATENT DOCUMENTS

| | | |
|---|---|---|
| CN | 108803244 A | 11/2018 |
| JP | 2016188878 A | 11/2016 |

* cited by examiner

*Primary Examiner* — Mesfin T Asfaw
(74) *Attorney, Agent, or Firm* — Canon U.S.A., Inc., IP Division

(57) ABSTRACT

An exposure apparatus configured to expose a substrate to light from a solid-state light emitting element, includes an illumination optical system configured to illuminate a mask with the light, and a projection optical system configured to project an image of a pattern of the mask onto the substrate, wherein a pupil plane intensity distribution, which is a light intensity distribution on a pupil plane included in the illumination optical system and optically conjugated with a light emission plane of the solid-state light emitting element, is a light intensity distribution in which a maximum intensity is achieved outside an optical axis of the illumination optical system, and wherein the pupil plane intensity distribution is a light intensity distribution on the pupil plane onto which a light emission distribution of the light emission plane is projected with a predetermined magnification.

20 Claims, 22 Drawing Sheets

100

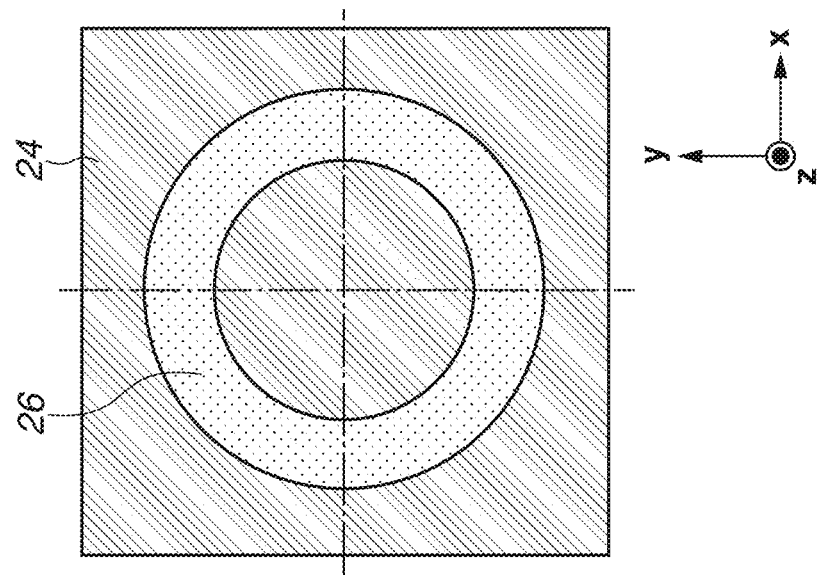
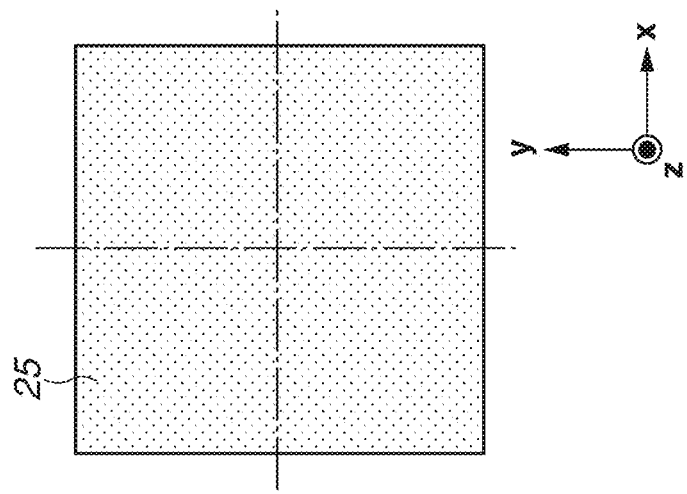
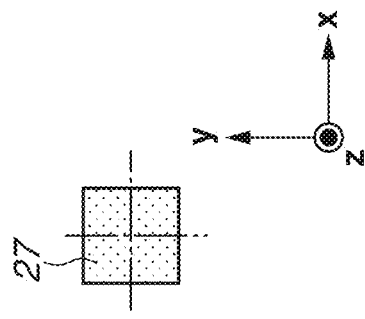

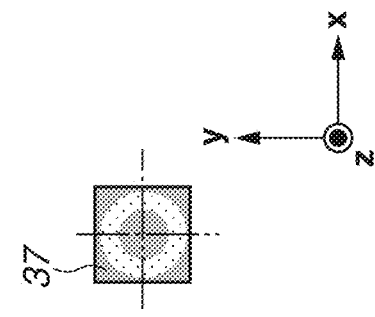
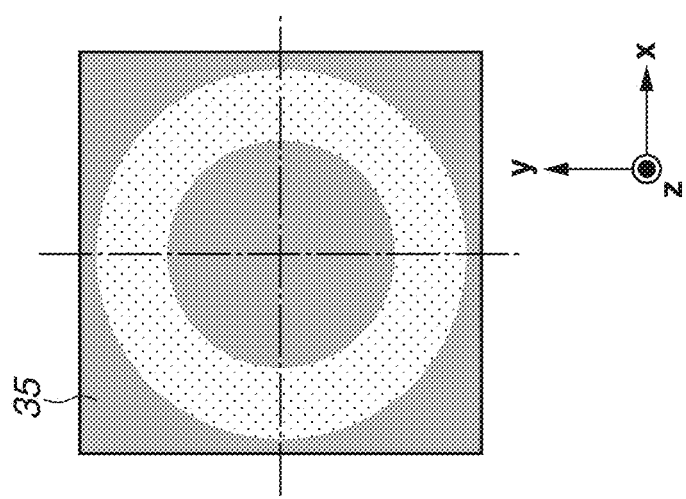
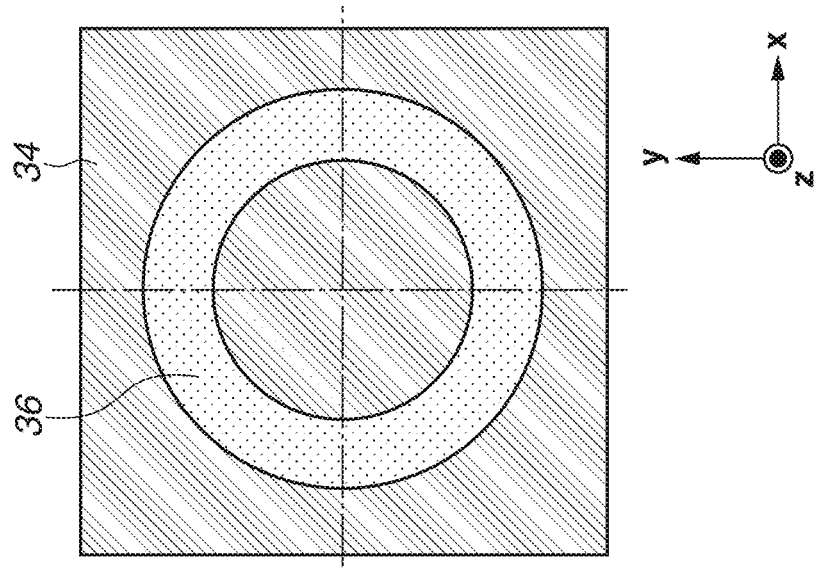

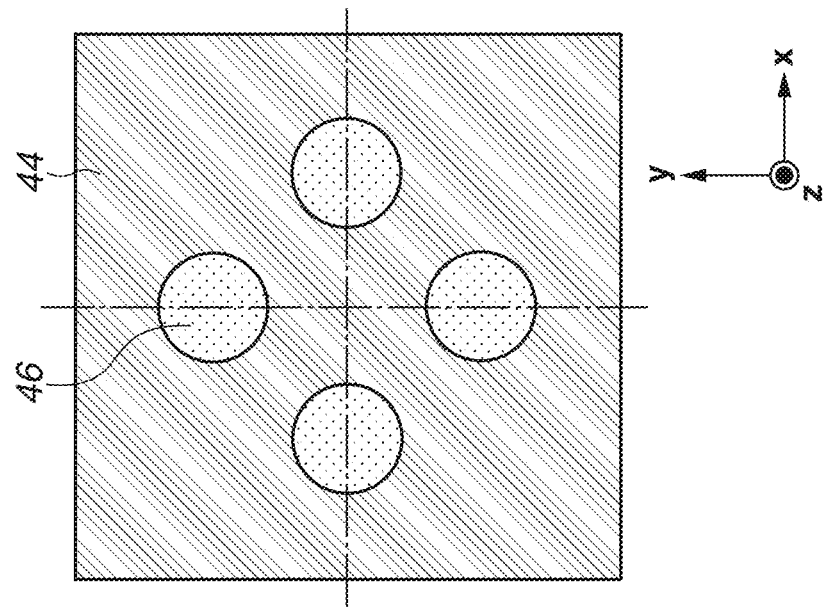
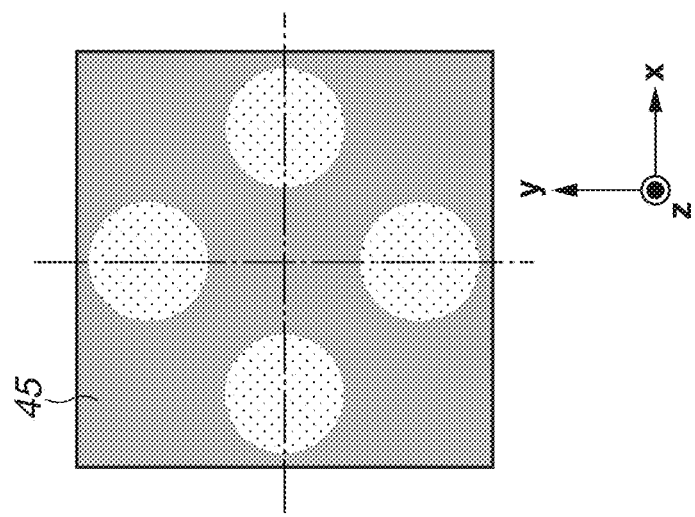
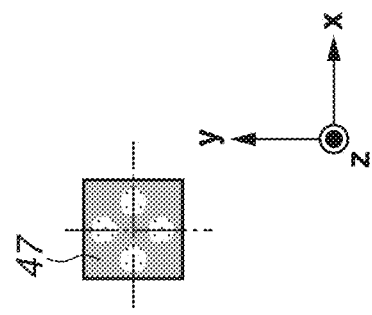

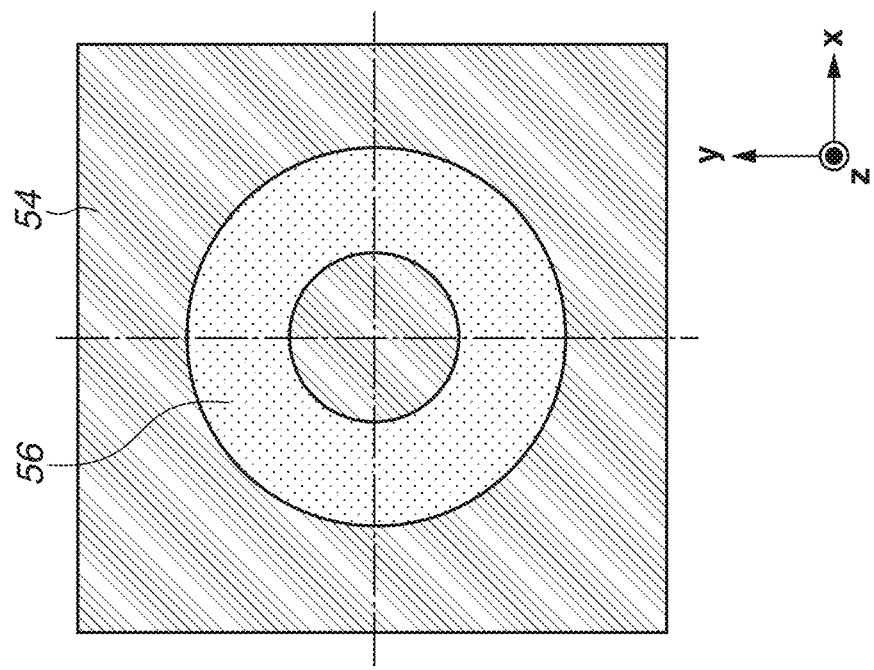
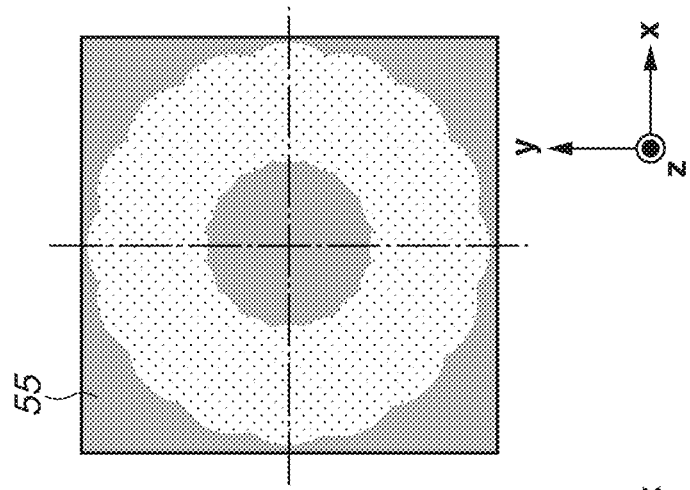
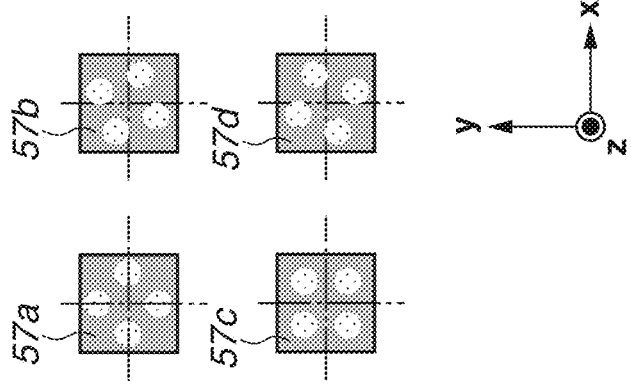

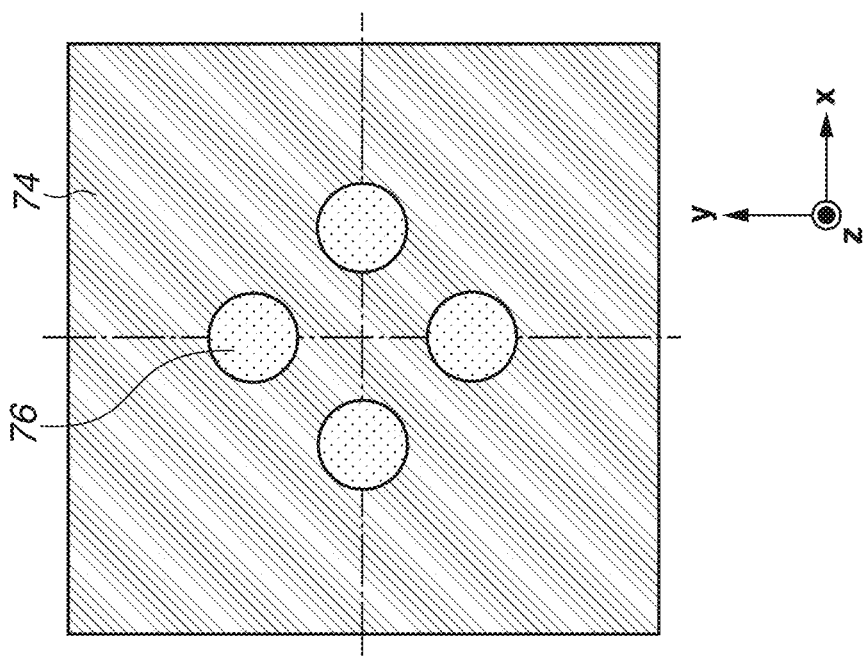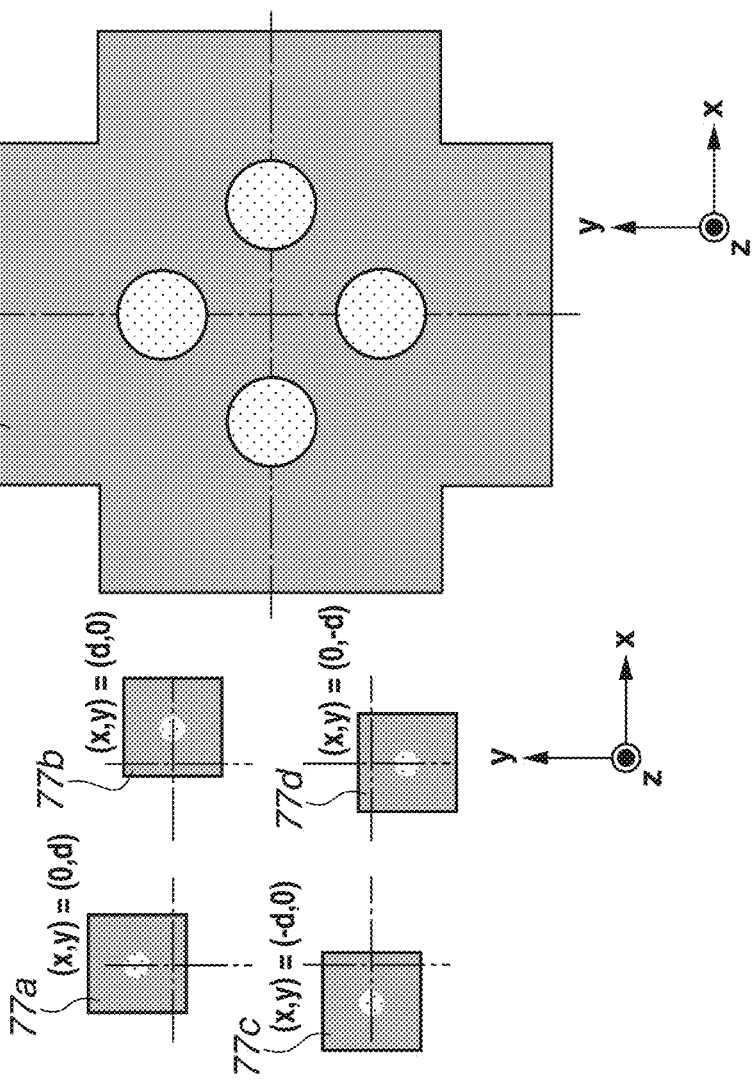

FIG.20

| | ANNULAR ILLUMINATION (COMPARATIVE EXAMPLE) 365nm: σ = 0.45 – 0.90 405nm: σ = 0.45 – 0.90 | EXAMPLE 5 365nm: σ = 0.45 – 0.90 405nm: σ = 0.70 – 0.90 |
|---|---|---|
| DISTRIBUTION DIAGRAM | 365 nm / 405 nm | 365 nm / 405 nm, 365 nm |
| AERIAL IMAGE INTENSITY CONTRAST | 0.57 | 0.59 |
| SIDE-WALL ANGLE [DEGREE] | 72.0 | 72.2 |
| RESIST DOF [μm] | 43.9 | 49.5 |

EXPOSURE APPARATUS, EXPOSURE METHOD, AND ARTICLE MANUFACTURING METHOD

BACKGROUND

Field of the Disclosure

The present disclosure relates to an exposure apparatus, an exposure method, and an article manufacturing method.

Description of the Related Art

An exposure apparatus is an apparatus for transferring a pattern formed on a mask (original) to a plate (substrate), and illuminates the mask (illuminated plane) via an illumination optical system, and projects an image of the pattern of the mask on the plate via a projection optical system. In the illumination optical system of the exposure apparatus, an optical integrator is illuminated with light from a light source, and a secondary light source is generated on an exit plane of the optical integrator equivalent to a pupil plane of the illumination optical system. The secondary light source is formed in a light emission region having a predetermined shape and a predetermined size. An effective light source distribution, which is a light amount distribution in the light emission region, corresponds to an angle distribution of light for illuminating each point of the mask.

For the exposure apparatus, resolution enhancement techniques (RET) are known as techniques for enhancing transfer performance for a fine pattern. A modified illumination technique for optimizing the angle distribution of the light for illuminating each point of the mask is known as one of the RET. For example, to improve resolving performance for a fine pattern, annular illumination with an annular shape as an effective light source distribution is used.

For example, a mercury lamp is used as the light source of the exposure apparatus, but in these days, a light emitting diode (LED), which is a solid-state light emitting element, is expected to replace the mercury lamp. With the LED, the time period until light output is stabilized after an electric current is fed to a board circuit for controlling light emission is short, and there is no need to emit the light constantly unlike the mercury lamp. Thus, the LED is advantageous in that the energy is saved and the life is long.

Japanese Patent Application Laid-Open No. 2016-188878 discusses a configuration of overlapping light emission distributions of a plurality of LEDs on a pupil plane of an illumination optical system to make an effective light source distribution uniform. Japanese Patent Application Laid-Open No. 2016-188878 also discusses use of modified illumination for improving resolving performance by providing an annular opening of an aperture diaphragm disposed at the pupil plane of the illumination optical system.

In general, an LED is configured to emit light at a uniform intensity in a light emission plane thereof, and thus a light intensity distribution at a pupil plane position is also uniform. Thus, to form modified illumination, it may be desirable to dispose an aperture diaphragm having a desired shape at a pupil plane of an illumination optical system to block the light. As a result, an illuminance decreases by a light shielding region of the aperture diaphragm, for the formation of the modified illumination.

SUMMARY OF THE INVENTION

The present disclosure is directed to an exposure apparatus that is advantageous for reducing a decrease in illuminance in modified illumination using an LED as a light source.

According to an aspect of the present disclosure, an exposure apparatus configured to expose a substrate to light from a solid-state light emitting element, includes an illumination optical system configured to illuminate a mask with the light, and a projection optical system configured to project an image of a pattern of the mask onto the substrate, wherein a pupil plane intensity distribution, including a light intensity distribution on a pupil plane included in the illumination optical system and optically conjugated with a light emission plane of the solid-state light emitting element having a maximum intensity achieved outside an optical axis of the illumination optical system, and wherein the pupil plane intensity distribution including a light intensity distribution on the pupil plane onto which a light emission distribution of the light emission plane is projected with a predetermined magnification.

Further features of the present invention will become apparent from the following description of exemplary embodiments with reference to the attached drawings.

BRIEF DESCRIPTION OF THE DRAWINGS

FIGS. 5A, 5B, and 5C are diagrams illustrating formation of annular illumination according to a comparative example.

FIGS. 6A, 6B, and 6C are diagrams illustrating formation of annular illumination according to Example 1.

FIGS. 10A, 10B, and 10C are diagrams illustrating formation of quadrupole illumination according to Example 1.

FIGS. 12A, 12B, and 12C are diagrams illustrating formation of annular illumination by a plurality of LEDs different in light emission distribution.

FIGS. 14A, 14B, and 14C are diagrams illustrating formation of quadrupole illumination by a plurality of LEDs different in decenter.

FIG. 20 is a table illustrating a simulation result according to Example 5.

DESCRIPTION OF THE EMBODIMENTS

Exemplary embodiments of the present invention will be described in detail below with reference to the attached drawings.

Figure 1:
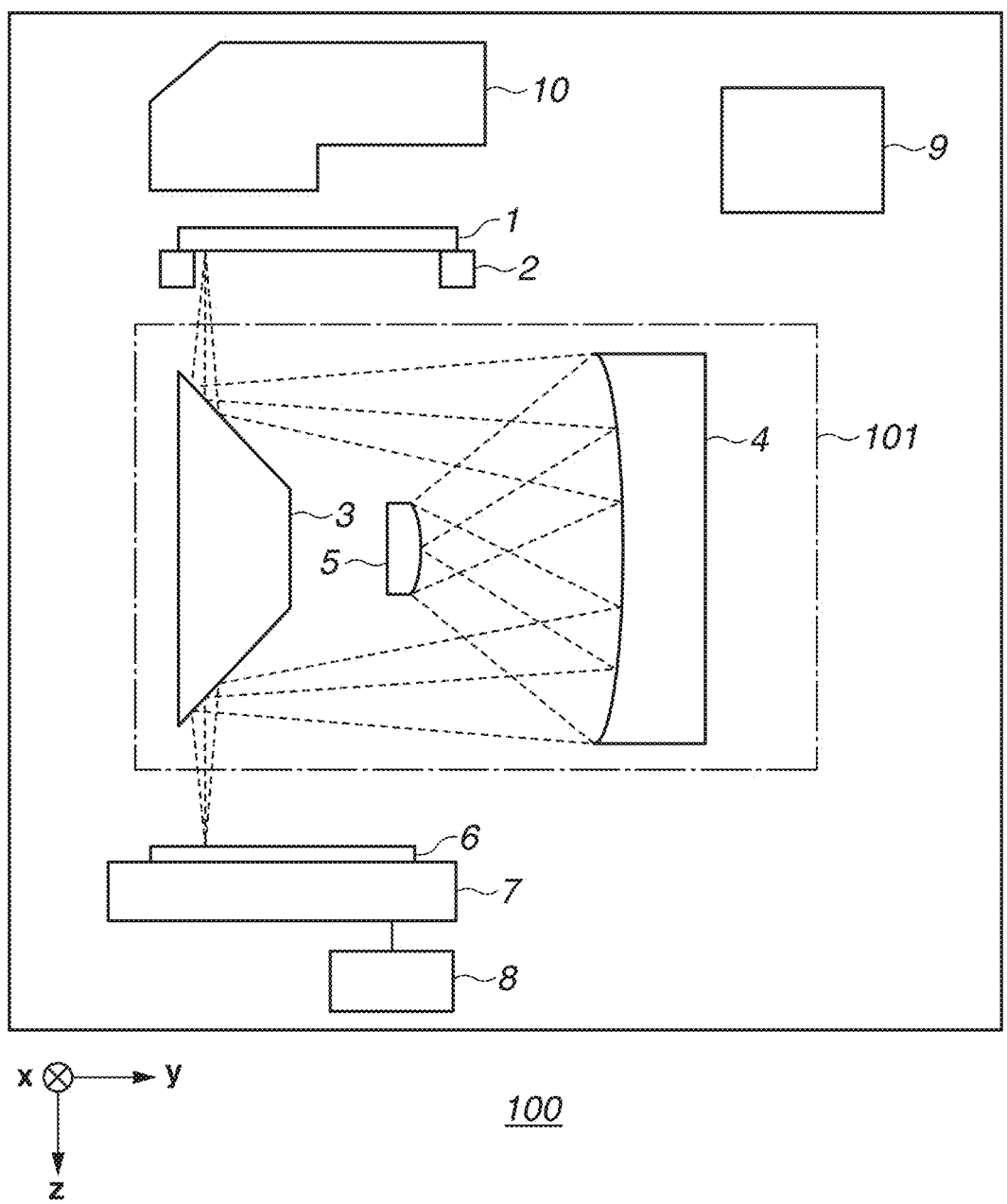
FIG. 1 is a schematic diagram illustrating a configuration of an exposure apparatus.

FIG. 1 is a schematic diagram illustrating a configuration of an exposure apparatus according to a first exemplary embodiment of the present invention. An exposure apparatus 100 according to the present exemplary embodiment is a lithography apparatus that illuminates a mask (original) 1, using light including a plurality of wavelength ranges, to transfer a pattern of the mask 1 to a plate (substrate) 6. The exposure apparatus 100 is an apparatus for manufacturing a flat-panel display, a semiconductor device, microelectromechanical systems (MEMS), etc.

The exposure apparatus 100 includes an illumination optical system 10 for illuminating the mask 1 (illuminated plane), using light from a light source, and a projection optical system 101 for projecting an image of a pattern formed on the mask 1 to the plate 6. The exposure apparatus 100 further includes a mask stage 2 for driving and positioning the mask 1 while holding the mask 1, a plate stage 7 for driving and positioning the plate 6 while holding the plate 6, a measurement unit 8 disposed at the plate stage 7, and a control unit 9. The mask 1 is disposed at an object plane of the projection optical system 101, and the plate 6 is disposed at an image plane of the projection optical system 101. The image plane is at a position optically conjugate with the object plane.

The projection optical system 101 is, for example, a reflecting optical system and includes mirrors 3, 4, and 5. The projection optical system 101 reflects light from the mask 1 in order of the mirrors 3, 4, 5, 4, and 3, and forms a projected image of the mask 1 on the plate 6. In a case where the projection optical system 101 is composed of the reflecting optical system, a chromatic aberration of light from a light source is smaller than in a refractive optical system. Such a configuration is suitable for a case where broadband light (broadband illumination light) including a plurality of wavelength ranges is used.

The control unit 9 comprehensively controls each unit of the exposure apparatus 100, such as the illumination optical system 10, the projection optical system 101, the mask stage 2, and the plate stage 7, to operate the exposure apparatus 100. The control unit 9 is composed of, for example, a programmable logic device (PLD) such as a field programmable gate array (FPGA), or an application specific integrated circuit (ASIC), or a general-purpose or exclusive computer, or the combination of all or some of these.

Figure 2:
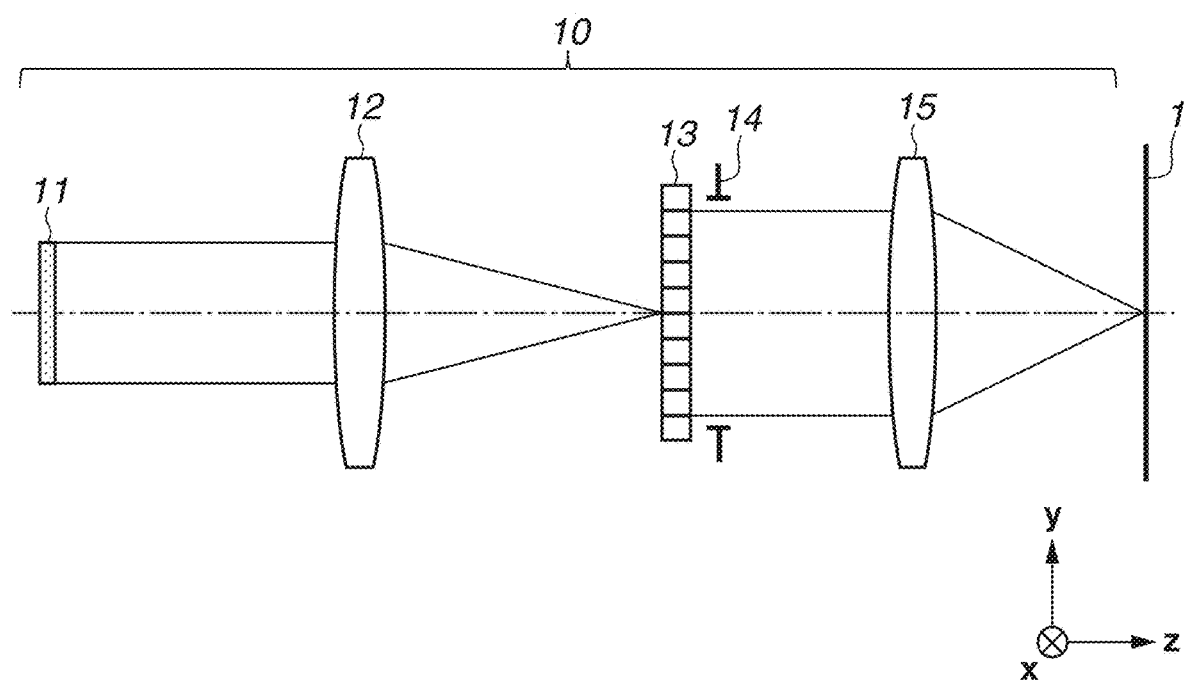
FIG. 2 is a schematic diagram illustrating a configuration of an illumination optical system.

FIG. 2 is a schematic diagram illustrating a configuration of the illumination optical system 10. The illumination optical system 10 includes a light source 11, condenser lenses 12 and 15, an optical integrator 13, and an aperture diaphragm 14.

The light source 11 is, for example, a light emitting diode (LED) array light source including a plurality of LEDs, which are solid-state light emitting elements, and the detailed configuration thereof will be described below. Light emitted from the light source 11 is condensed by the condenser lens 12 to irradiate the optical integrator 13 therewith. As for positional relationships, an exit plane of the light source 11 is located near a front focal position of the condenser lens 12, and an incident plane of the optical integrator 13 is located near a rear focal position of the condenser lens 12. In this case, the exit plane of the light source 11 and the incident plane of the optical integrator 13 do not need to completely agree with the focus position of the condenser lens 12, and may be located, for example, within 10% from a focal length.

The optical integrator 13 is, for example, a fly-eye lens, and is composed of multiple identical lens elements. The optical integrator 13 performs wavefront-division of the light on the incident plane, and forms a multiple light source image of the light source 11 on an exit plane thereof. In other words, an optical image of the light source 11 is formed on the exit plane of each of the multiple lens elements forming the optical integrator 13, and this serves as a secondary light source. The aperture diaphragm 14 disposed near the exit plane of the optical integrator 13 controls an angle distribution of the light for irradiating the mask 1. For example, the aperture diaphragm 14 can form modified illumination such as annular or quadrupole illumination by providing an annular transmissive region or a quadrupole transmissive region. The light passing through the aperture diaphragm 14 is condensed by the condenser lens 15 and used to irradiate the mask 1 as illumination light. Further, the plate stage 7 is provided with the measurement unit 8, which is an image sensor (e.g., a charge coupled device (CCD) sensor), capable of measuring the shape and light intensity of the secondary light source formed on the exit plane of the optical integrator 13.

The pupil plane position of the illumination optical system 10 is equivalent to the exit plane of the optical integrator 13. Further, an optically Fourier-transformed plane with respect to a plane where the mask 1 is disposed is equivalent to the pupil plane position. A pupil plane intensity distribution refers to the light amount distribution of the exit plane of the optical integrator 13. An effective light source distribution is the angle distribution of the light for illuminating the mask 1, and is equivalent to the light amount distribution of the light having passed through the aperture diaphragm 14 in FIG. 2. In this case, in a case where the aperture diaphragm 14 is not provided, the pupil plane intensity distribution and the effective light source distribution are identical. The modified illumination according to the present exemplary embodiment is described to be illumination in which the effective light source distribution has an annular or quadrupole shape, but the effective light source distribution is not limited thereto, and refers to all types of effective light source distributions different from a circular and substantially uniform distribution.

In a case where the number of divisions of the optical integrator 13 is infinite (i.e., the size of one of the lens elements is infinitesimal), the light amount distribution of the incident plane of the optical integrator 13 and the pupil plane intensity distribution, which is the light amount distribution of the exit plane, are identical. In a case where the number of divisions of the optical integrator 13 is limited, the light amount distribution of the incident plane and the pupil plane intensity distribution do not necessarily agree with each other. However, there is a high correlation between these distributions, and thus the light amount distribution of the incident plane of the optical integrator 13 can be referred to as "pupil plane intensity distribution".

Figure 3A:
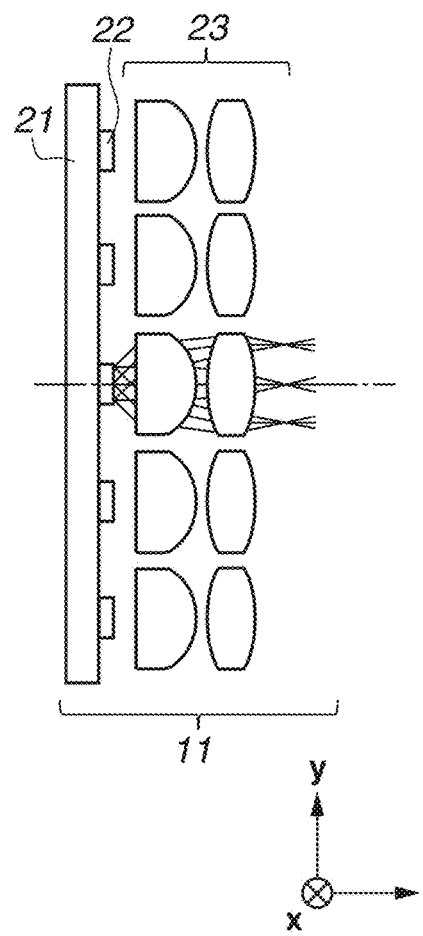
FIGS. 3A and 3B are diagrams illustrating a configuration of a light emitting diode (LED) array light source.
Figure 3B:
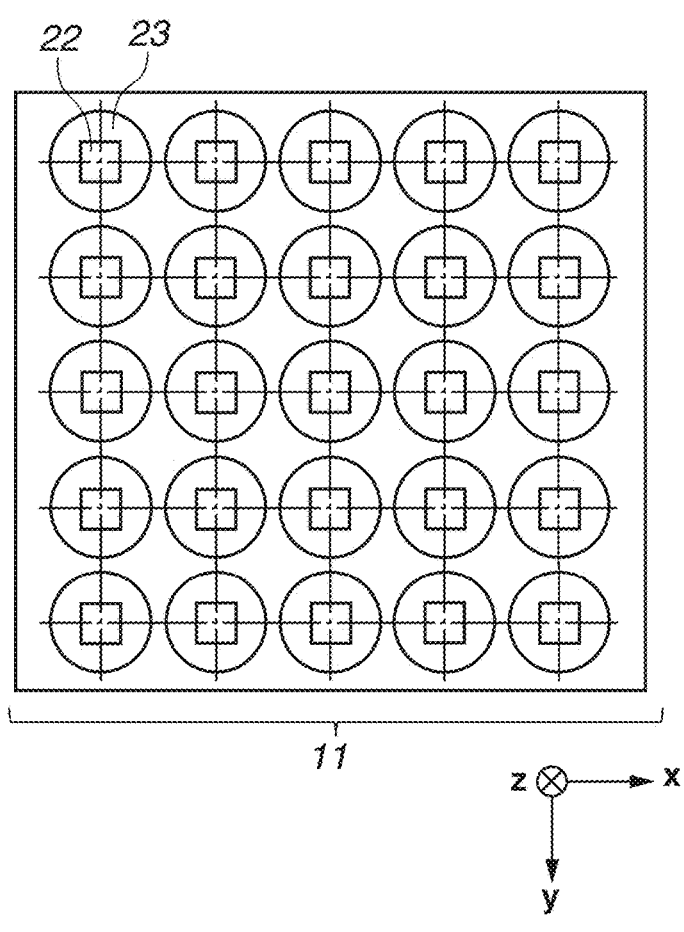

Next, a configuration of the light source 11 will be described with reference to FIGS. 3A and 3B. FIG. 3A is a schematic diagram illustrating a cross section of the light source 11 viewed from an x-axis direction, and FIG. 3B is a schematic diagram illustrating the light source 11 viewed from a z-axis direction. The light source 11 is configured of a plurality of LEDs 22 implemented on a base 21. The LED 22 has smaller radiant energy than that of a high pressure mercury lamp, and thus it may be necessary to use the plurality of LEDs 22, and, for example, about the one thousand LEDs 22 are implemented on the base 21. The LEDs 22 are two-dimensionally arranged on the base 21, more specifically, arranged in a square lattice in FIG. 3B, but are not limited to such an array, and may be arranged in other form, for example, a staggered pattern.

The LED 22 is an ultraviolet LED (UV-LED) that emits UV light, and the wavelength of an emission peak thereof is, for example, 365 nm, 385 nm, or 405 nm. The plurality of LEDs 22 may all have the identical emission wavelengths, or the LEDs 22 different in emission wavelength may be arranged in a mixed manner on the same base. In the light emitted from the LED 22, the half angle of a radiation angle is about 60 to 70 degrees, and an angle distribution is large, considering that the numerical aperture (NA) of a projection optical system for an ordinary flat-panel display is about 0.1 (about 5.7 degrees when converted into an angle). Therefore, in order to take a radiation beam from the LED 22 in the downstream optical system without loss, it is desirable that a light condensing unit 23 for collimating the radiation beam is disposed immediately over each of the LEDs 22.

The light condensing unit 23 is provided with a collimate lens corresponding to each of the LEDs 22. An intersection where dashed-dotted lines intersect in FIG. 3B represents the optical axis of each of the collimate lenses included in the light condensing unit 23. In the present exemplary embodiment, each of the collimate lenses is illustrated to agree with the center of each of the LEDs 22, but is not necessarily disposed in such a manner.

A light emission plane of the LED 22 is located near a front focal position of the light condensing unit 23, so that a distribution obtained by Fourier-transforming light ray information on the light emission plane of the LED 22 is formed near a rear focal position of the light condensing unit 23. If this rear focal position of the light condensing unit 23 is located near the front focal position of the condenser lens 12, the light emission plane of the LED 22 and the incident plane of the optical integrator 13 are optically conjugated with each other. The light emission planes of all the LEDs 22 and the incident plane of the optical integrator 13 are optically conjugated with each other, by similarly configuring all the LEDs 22. In other words, the optical images on the light emission planes of all the LEDs 22 are superimposed and projected on the incident plane of the optical integrator 13, so that the pupil plane intensity distribution is formed. In this case, all the LEDs 22 do not necessarily have similar configurations, it is sufficient if the above-described relationship is established for most of the LEDs 22, for example, 90% or more of the LEDs 22.

Figure 4:
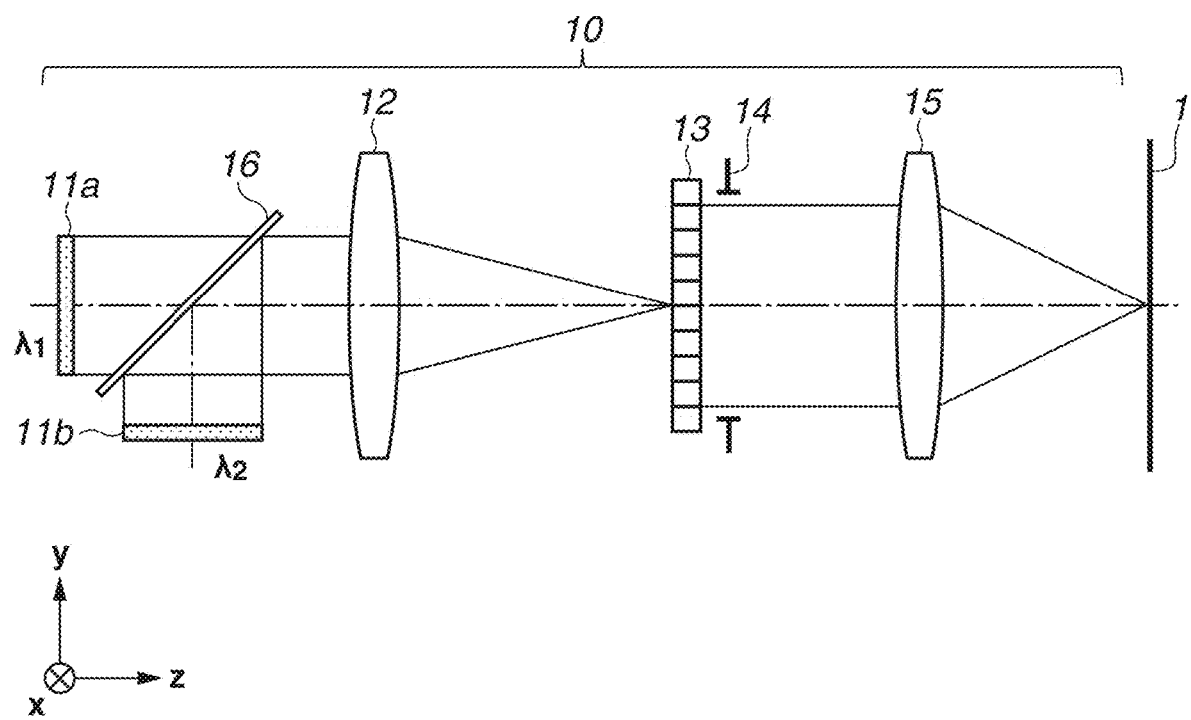
FIG. 4 is a diagram illustrating another configuration example of the illumination optical system.

Next, a modification example of the illumination optical system 10 will be described with reference to FIG. 4. A point different from the illumination optical system 10 described with reference to FIG. 2 is that a plurality of LED array light sources is included. In FIG. 4, two light sources 11a and 11b irradiate the mask 1. The light source 11a includes a plurality of first LEDs having a first wavelength characteristic $\lambda 1$, and the light source 11b includes a plurality of second LEDs having a second wavelength characteristic $\lambda 2$. The first LED having the first wavelength characteristic $\lambda 1$ is, for example, an LED that emits a light beam at a peak wavelength of 365 nm, and the second LED having the second wavelength characteristic $\lambda 2$ is, for example, an LED that emits a light beam at a peak wavelength of 405 nm.

The light beams different in wavelength characteristic emitted from the light sources 11a and 11b are combined by a wavelength combining unit 16 and guided to the condenser lens 12. The wavelength combining unit 16 is, for example, a dichroic mirror, and is a glass forming a reflection optical thin film that transmits the light beam of 365 nm and reflects the light beam of 405 nm. Such a configuration enables a larger amount of light to be guided to the optical integrator 13 than in the illumination optical system 10 described with reference to FIG. 2.

Also in the case of the configuration of the illumination optical system 10 described with reference to FIG. 4, the light emission planes of the plurality of first LEDs included in the light source 11a and the incident plane of the optical integrator 13 are optically conjugated with each other. In other words, optical images on the light emission planes of the plurality of first LEDs are superimposed and projected on the incident plane of the optical integrator 13. Similarly, the light emission planes of the plurality of second LEDs included in the light source 11b and the incident plane of the optical integrator 13 are optically conjugated with each other. In other words, optical images on the light emission planes of the plurality of second LEDs are superimposed and projected on the incident plane of the optical integrator 13.

Comparative Example

A comparative example of formation modified illumination will be described for a comparison with the present exemplary embodiment. FIGS. 5A, 5B, and 5C are schematic diagrams concerning formation of annular illumination in the comparative example. FIG. 5A illustrates a light emission distribution 27 that is a light amount distribution of a light emission plane of one of LEDs 22, FIG. 5B illustrates a pupil plane intensity distribution 25 on a pupil plane, and FIG. 5C illustrates an aperture diaphragm 24 having an annular shape. The aperture diaphragm 24 has a transmissive region for transmitting light and a light shielding region for blocking central and peripheral light. The transmissive region is indicated by dots and the light shielding region is indicated by hatched lines in FIG. 5C. Because the light passes through only the transmissive region of the aperture diaphragm 24, the shape of an effective light source distribution 26 is determined by the shape of the aperture diaphragm 24.

The intersection of dashed-dotted lines in FIG. 5A corresponds to the optical axis of a collimate lens included in a light condensing unit 23 that collimates a light beam emitted from the LED, and the intersection of dashed-dotted lines in each of FIGS. 5B and 5C corresponds to the optical axis of an illumination optical system 10. Each of the plurality of LEDs 22 has the light emission distribution 27 illustrated in FIG. 5A. In the comparative example, the light emission distribution 27 is a substantially uniform light emission distribution, and the light emission plane thereof is projected on the pupil plane, and thus the pupil plane intensity distribution 25 is a substantially uniform intensity distribution.

In the comparative example, because the pupil plane intensity distribution 25 illustrated in FIG. 5B is a substantially uniform intensity distribution, the larger the region for blocking the light using the aperture diaphragm 24 is, the larger the light amount of the light source is lost. In particular, in the above-described modified illumination such as annular illumination, a large amount of light is lost because the region for blocking the light is large. In an exposure apparatus, a decrease in the light amount of a light source increases the time consumed for processing a plate 6 (e.g., processing for exposing the plate 6), leading to such an issue that productivity for processing the plate 6 deteriorates.

It is conceivable that the above-described issue is solved by feeding a larger amount of electric current to the LED 22 to increase the amount of light of the LED 22 itself, but other issues may arise. For example, there is such an issue that a temperature at which the LED 22 can operate normally is exceeded due to a temperature rise caused by the large amount of electric current flowing through the LED 22, and there is also such an issue that the life of the LED 22 is reduced by the large amount of electric current flowing through the LED 22. Therefore, it is desirable to improve the light amount of the effective light source distribution 26 in a different way.

Accordingly, the present exemplary embodiment provides a technique for focusing the light on the transmissive region of the aperture diaphragm 24 to reduce the amount of light in the light shielding region of the aperture diaphragm 24. This can reduce the loss of the light amount when the modified illumination is formed.

Example 1

In Example 1, the formation of the modified illumination in a case where the light emission distribution and the pupil plane intensity distribution are the same will be described. The modified illumination is, for example, annular illumination having an illumination shape of rotational symmetry, or quadrupole illumination having an illumination shape of fourfold rotational symmetry. In the following, the modified illumination indicating fourfold-or-more rotational symmetry will be described. FIGS. 6A, 6B, and 6C are diagrams illustrating Example 1.

FIG. 6A illustrates a light emission distribution 37 of one of the LEDs 22, FIG. 6B illustrates a pupil plane intensity distribution 35 on the pupil plane, and FIG. 6C illustrates an aperture diaphragm 34 having an annular shape. The aperture diaphragm 34 has a transmissive region for transmitting light and a light shielding region for blocking central and peripheral light. The transmissive region is indicated by dots and the light shielding region is indicated by hatched lines in FIG. 6C. Because the light passes through only the transmissive region of the aperture diaphragm 34, the shape of an effective light source distribution 36 is determined by the shape of the aperture diaphragm 34.

The intersection of dashed-dotted lines in FIG. 6A corresponds to the optical axis of the collimate lens included in the light condensing unit 23 that collimates the radiation beams from the LEDs 22, and the intersection of dashed-dotted lines in each of FIGS. 6B and 6C corresponds to the optical axis of the illumination optical system 10. The light emission distribution 37 in FIG. 6A is an annular light emission distribution, unlike the light emission distribution 27 that is substantially uniform in FIG. 5A.

In FIG. 6A, each of the plurality of LEDs 22 has the light emission distribution 37 illustrated in FIG. 6A. Here, a region indicated by a dot pattern is a light emission region, and other region indicated by gray color is a non-light emission region, in each of FIGS. 6A and 6B. Here, the non-light emission region also includes a region where weak light is emitted but the intensity is low relative to the light emission region. For example, a region where the light emission intensity is 20% or less relative to the value of the maximum light emission intensity of the light emission distribution 37 is defined to be the non-light emission region.

The light emission distribution 37 having the annular light emission region is projected on the pupil plane, and thus the pupil plane intensity distribution 35 having an annular shape and achieving a maximum light intensity outside the optical axis of the illumination optical system 10 is formed. This light emission region is configured to correspond to the transmissive region of the aperture diaphragm 34, and thus the amount of light blocked by the light shielding region of the aperture diaphragm 34 is smaller than that in the comparative example, and the amount of light passing through the transmissive region of the aperture diaphragm 34 is larger than that in the comparative example.

Figure 7A:
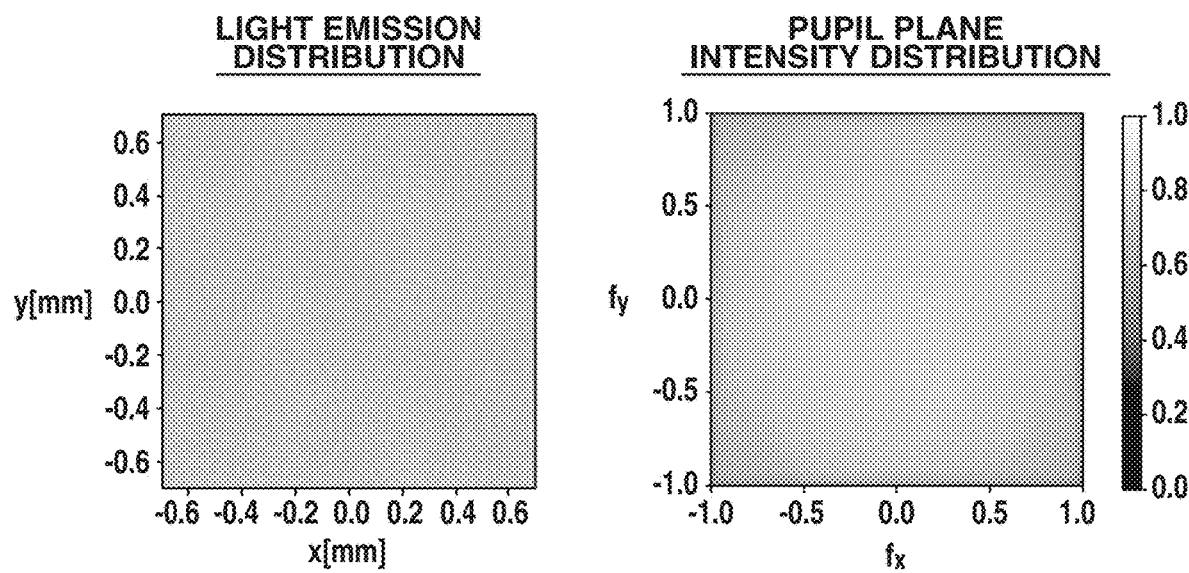
FIGS. 7A and 7B illustrate a simulation result of the comparative example and a simulation result of Example 1, respectively.
Figure 7B:
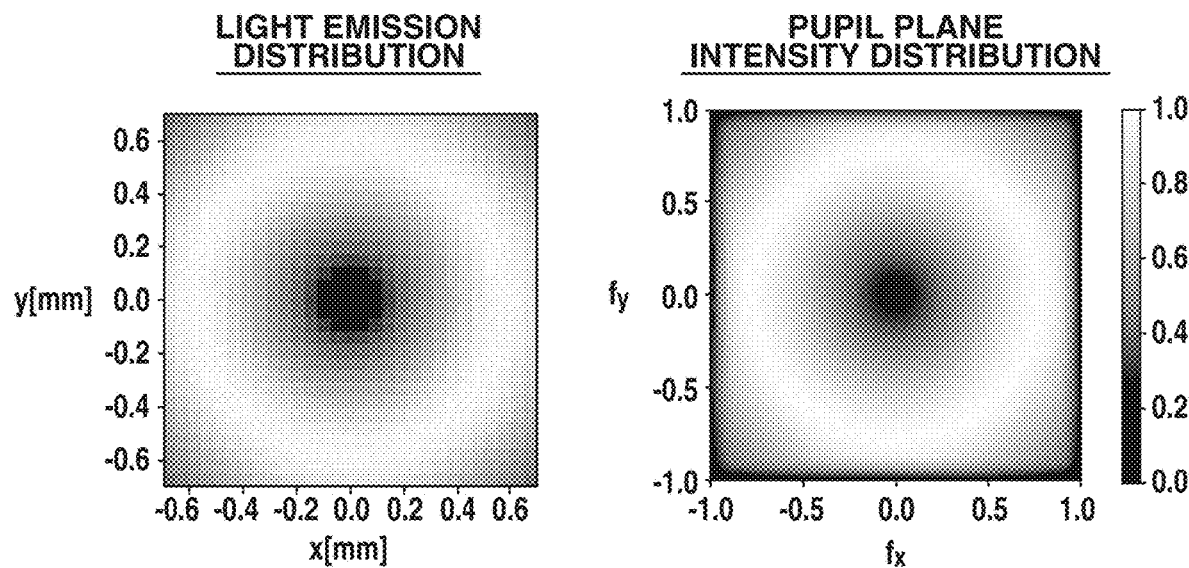

Next, the result of quantitatively evaluating the effect in Example 1 by simulation will be described. FIGS. 7A and 7B are diagrams illustrating a simulation result of each of the comparative example and Example 1. FIG. 7A illustrates the light emission distribution of the LED 22 and the pupil plane intensity distribution in the comparative example, and FIG. 7B illustrates the light emission distribution of the LED 22 and the pupil plane intensity distribution in Example 1. The light emission region of the LED 22 is a square region of 1.4 mm×1.4 mm in both of FIGS. 7A and 7B, and is set so that the total emission energies are equal.

Further, in both of FIGS. 7A and 7B, the light condensing unit is composed of two collimate lenses, and the focal length of the light condensing unit is 6.56 mm in FIG. 7A, and 6.88 mm in FIG. 7B. In the pupil plane intensity distribution, values obtained by normalizing the angle distribution of the light emitted from the light condensing unit based on a numerical aperture NA of the projection optical system are represented by a horizontal axis fx and a vertical axis fy.

Further, in the scale of the pupil plane intensity distribution, the amount of light included in a minute solid angle is plotted as vertical gradation. The light emission distribution of the LED and the vertical gradation of the image in the pupil plane intensity distribution are both normalized using the maximum value of data in FIG. 7B. Here, the ratio of the extent of the illumination light to the numerical aperture NA will be referred to as "coherence factor σ". The relationship with coordinates fx, fy is $\sigma = \sqrt{(fx^2 + fy^2)}$.

The light emission distribution of the LED 22 in FIG. 7A illustrating the simulation of the comparative example is uniform, and thus the pupil plane intensity distribution is also a substantially uniform distribution in a range of σ<1.0. The intensity decreases in a peripheral portion of σ>1.0, because the light emitted from the peripheral portion of the LED has a high ray height incident on the collimate lens, and is not easily condensed under the influence of the aberration of the lens. On the other hand, in the light emission distribution of the LED 22 in FIG. 7B illustrating the simulation of Example 1, the light is intensely emitted in the annular shape. The pupil plane intensity distribution is also a distribution in which the light is intensely emitted in the annular shape.

Figure 8:
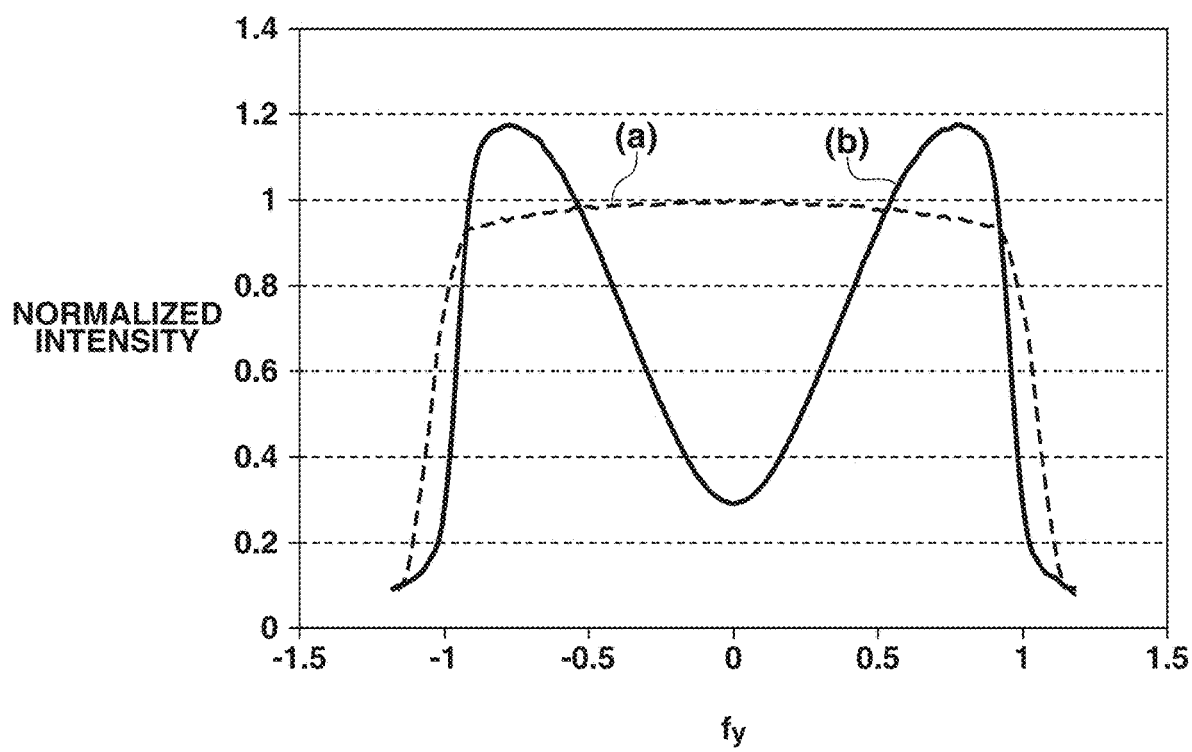
FIG. 8 is a diagram illustrating an intensity profile of a pupil plane intensity distribution according to each of the comparative example and Example 1.

FIG. 8 is an intensity profile indicating a normalized intensity at fx=0 of the pupil plane intensity distribution in each of FIGS. 7A and 7B. A dashed line (a) in FIG. 8 corresponds to FIG. 7A, and indicates a substantially uniform distribution. A solid line (b) in FIG. 8 corresponds to FIG. 7B, and indicates a distribution taking the maximum value at |fy|=0.80, and localized outward from the optical axis of the illumination optical system 10 as the center. When the intensities are compared, the dashed line (a) is higher at |fy|<0.52, and the solid line (b) is higher at 0.52<|fy|<0.93.

Figure 9:
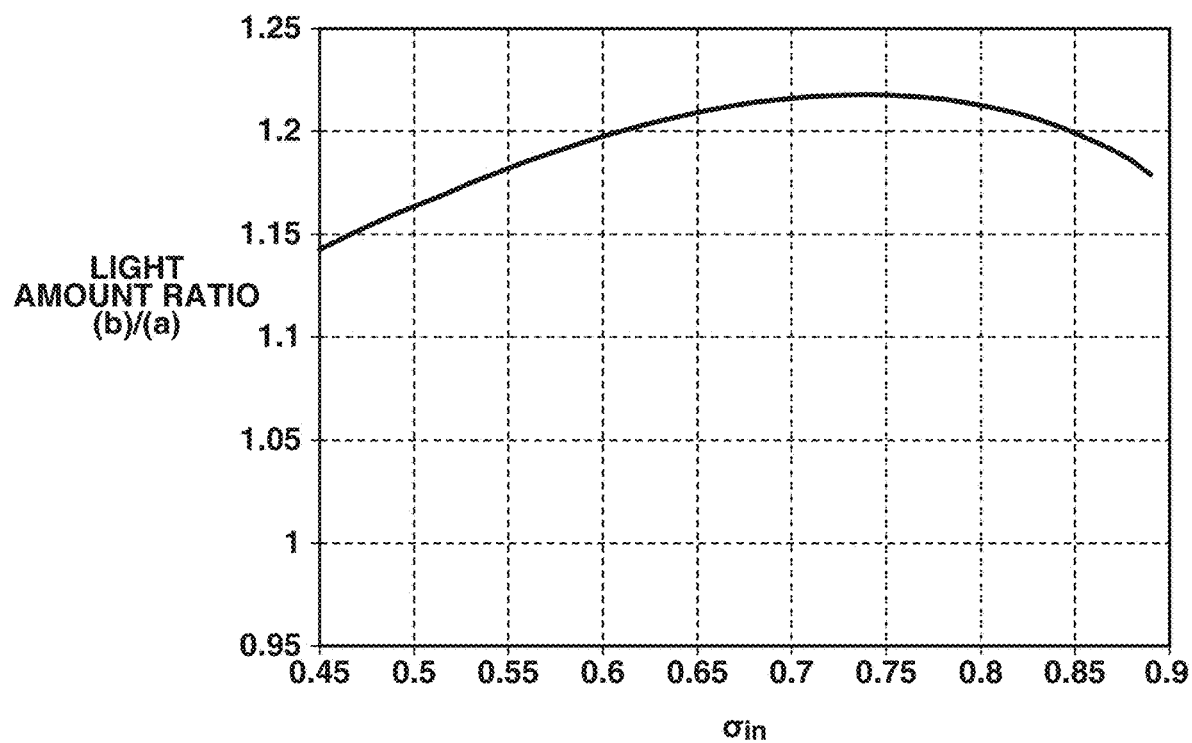
FIG. 9 is a graph illustrating a light amount ratio of Example 1 with respect to the comparative example.

FIGS. 7A and 7B are compared in terms of the amount of light in the annular region, based on the result illustrated in FIG. 8. In other words, the light amount of the effective light source distribution in a case where an annular aperture diaphragm is disposed is evaluated. FIG. 9 is a graph illustrating a value obtained by dividing the amount of light included in a region of $\sigma_{in}<6<0.90$ in the pupil plane intensity distribution at fx=0 in FIG. 7A by the amount of light included in a region of $\sigma_{in}<6<0.90$ at fx=0 in the pupil plane intensity distribution in FIG. 7B. In this case, $\sigma_{in}$ indicates the lower limit of the annular region, and is a variable that takes a value of $0.45<\sigma_{in}<0.90$. In other words, the upper limit of the annular zone is fixed at $\sigma=0.90$, and the light amount ratio is evaluated for various annular zone widths. For example, $\sigma_{in}=0.60$ in FIG. 9 represents the light amount ratio of the solid line (b) to the dashed line (a) in an annular zone where $\sigma$ is 0.60 to 0.90. Although varying depending on the width of the annular zone, the light amount of the solid line (b) is always larger. For example, in an annular zone where $\sigma$ is 0.45 to 0.90, the light amount ratio is 1.14, and there is a gain of 14% of the light amount in Example 1 with respect to the comparative example. Further, in an annular zone where $\sigma$ is 0.70 to 0.90, the light amount ratio is 1.22, and there is a gain of 22% of the light amount in Example 1 with respect to the comparative example.

Next, an example in which a light emission distribution not having an annular shape will be described with reference to FIGS. 10A, 10B, and 10C. FIG. 10A illustrates a light emission distribution 47 having a quadrupole shape, FIG. 10B illustrates a pupil plane intensity distribution 45 on the pupil plane, and FIG. 10C illustrates an aperture diaphragm 44 having a quadrupole shape and an effective light source distribution 46. In a light emission region of the light emission distribution 47, light is emitted in a quadrupole shape, and the light emission region is configured to correspond to a transmissive region of the aperture diaphragm 44 in the quadrupole shape. In the quadrupole illumination, a region shielded by the aperture diaphragm 44 is large compared to the annular illumination, and thus the amount of light guided to the mask 1 is small. Accordingly, in the quadrupole illumination in the present exemplary embodiment, there is a large gain of the light amount compared to the case of the annular illumination.

In the present exemplary embodiment, in order to obtain an effect of restraining a decrease in illuminance, it may be desirable for the light emission distribution of the LED to be a distribution corresponding to a target effective light source distribution. In other words, a distribution obtained by back-projecting the target effective light source distribution may be the light emission distribution of the LED. Further, the distribution obtained by the back projection and the light emission distribution of the LED may not be completely the same. For example, such a light emission distribution that the LED emits the light most intensely in a region with the highest light intensity in the light intensity distribution obtained by the back projection. This will be described with reference to FIGS. 11A, 11B, 11C, and 11D.

Figure 11C:
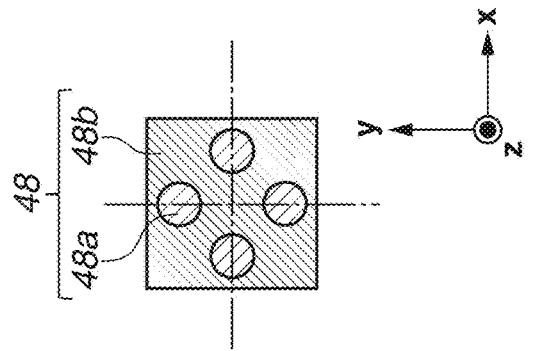
FIGS. 11A, 11B, 11C, and 11D are diagrams illustrating a back projection distribution formed by back-projecting an effective light source distribution.
Figure 11B:
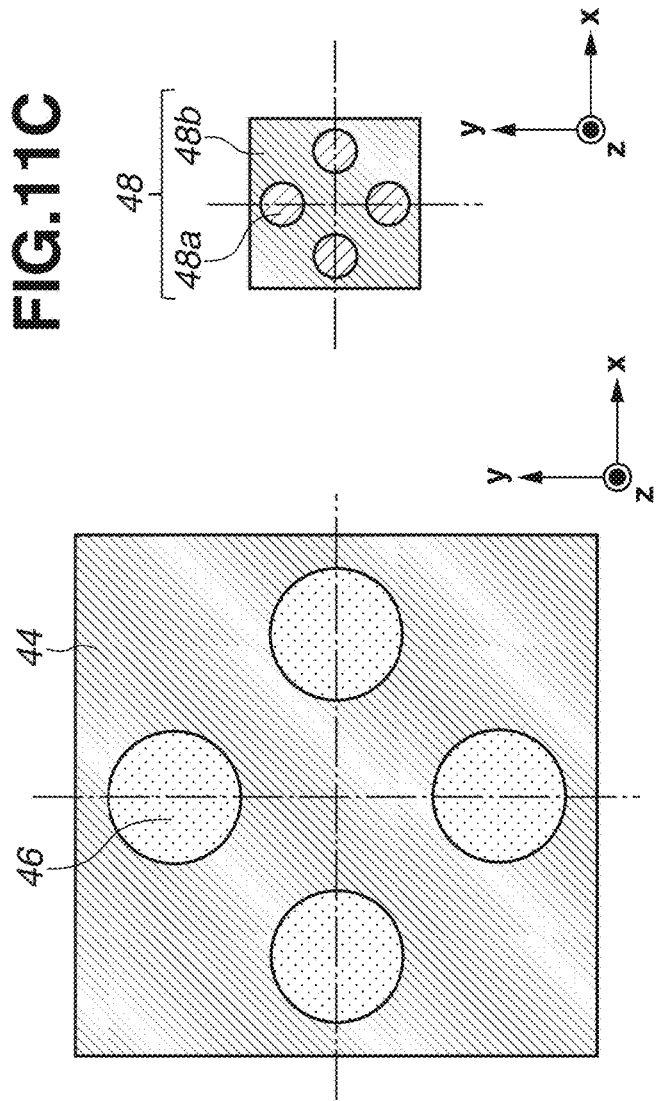
Figure 11A:
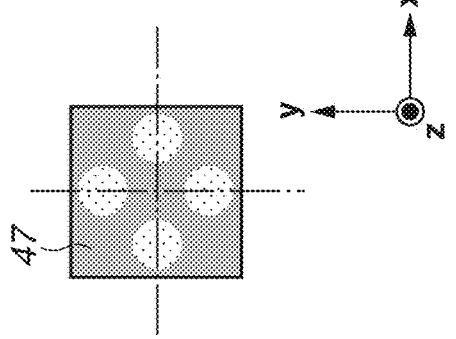

FIGS. 11A and 11B are similar in meaning to FIGS. 10A and 10C, respectively. FIG. 11A illustrates the light emission distribution 47, and FIG. 11B illustrates the aperture diaphragm 44 having the quadrupole shape and the effective light source distribution 46. A distribution obtained by back-projecting the effective light source distribution 46 with respect to the light emission plane of the light emission distribution 47 is a back projection distribution 48 in FIG. 11C. Here, the back projection will be described. The light emission plane of the LED and the pupil plane position of the illumination optical system are configured to be optically conjugated with each other, and the optical image on the light emission plane of the LED is enlarged to a predetermined projection magnification and projected at the pupil plane position of the illumination optical system. The back projection refers to virtually projecting the light intensity distribution on the pupil plane with the magnification of the reciprocal for the projection magnification. A region 48a indicated by a circle with diagonally right down lines of the back projection distribution 48 corresponds to a light emission region in the effective light source distribution 46 of the light having passed through the aperture diaphragm 44.

Figure 11D:
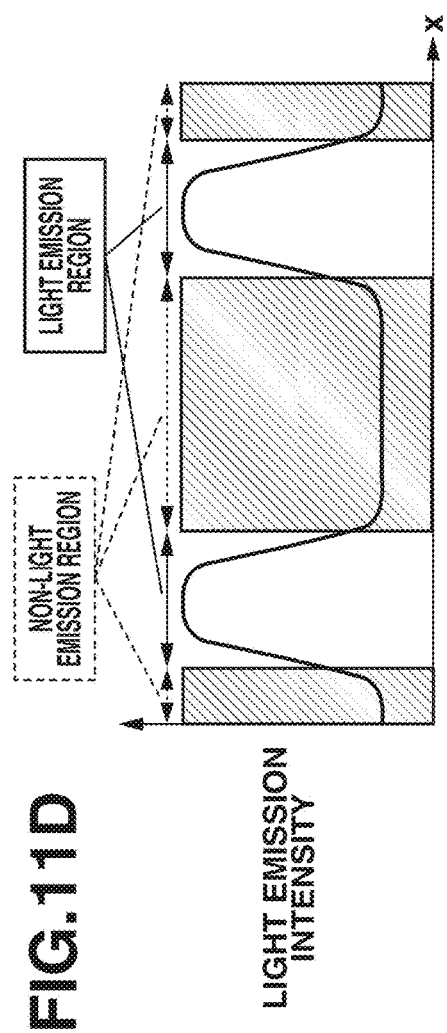

A region 48b indicated by a hatched-line pattern of the back projection distribution 48 corresponds to a non-light emission region in the effective light source distribution 46 of the light blocked by the aperture diaphragm 44. FIG. 11D illustrates a profile of the light emission intensity of the LED, on a dashed-dotted line parallel to an x-axis among dashed-dotted lines in FIG. 11C. The region indicated by hatched lines in FIG. 11D corresponds to the region (hatched-line pattern region) 48b of the back projection image, i.e., the non-light emission region of the effective light source distribution 46. Other region corresponds to the light emission region of the effective light source distribution 46. As illustrated in FIG. 11D, a region having a high light emission intensity in the plane of the LED is included in the region (light emission region) 48a of the back projection image of the effective light source distribution 46. Such a configuration can focus the radiation beam of the light emission distribution 47 on the transmissive portion of the aperture diaphragm 44, and thus can reduce the loss of the amount of light by the aperture diaphragm 44.

Further, in a case where the plurality of LEDs is included in the light source, the effective light source distribution is back-projected with respect to each of the LEDs, and the correspondence between the light emission distribution of the LED and the effective light source distribution is evaluated. At this time, there is no need for all the LEDs to satisfy the above-described condition, and it is sufficient if, for example, 90% or more of the LEDs satisfy the above-described condition.

The case where the aperture diaphragm 44 is provided is described above, but in a case where the aperture diaphragm 44 is not provided, there is a possibility that a complete non-light emission region is not formed in the effective light source distribution. In this case, for example, using 50% of the maximum intensity of the effective light source distribution as a threshold, a region where the light emission intensity is 50% or more may be defined as the light emission region, and a region where the light emission intensity is less than 50% may be defined as the non-light emission region.

In the present exemplary embodiment, a quantitative condition for further enhancing the effect of restraining the decrease in illuminance will be described. In a case where the region of the light emission plane of the LED is S, the region of the back projection image of the effective light source distribution is S', and the light emission distribution (a light emission intensity distribution per unit area) on the light emission plane of the LED is I(x,y), a characteristic value defined in the following expression (1) may be 1.13 or more.

$$\left(\frac{\int_{S'} I(x, y)dS'}{\int_S I(x, y)dS}\right) \bigg/ \left(\frac{\int_{S'} dS'}{\int_S dS}\right) \quad (1)$$

The following expression (2) in the expression (1) is the ratio between the area of the light emission region of the back projection image of the effective light source distribution and the area of the light emission plane of the LED. In other words, the expression (2) corresponds to a value obtained by normalizing the amount of light that can pass through the aperture diaphragm by using the total amount of light emission of the LED, in a case where the light emission distribution of the LED is completely uniform. In other words, the expression (2) represents the ratio of the energy that can pass through the aperture diaphragm to the total light emission energy of the LED, in a case where the light emission distribution of the LED is completely uniform.

$$\left(\frac{\int_{S'} dS'}{\int_S dS}\right) \quad (2)$$

The following expression (3) in the expression (1) is the ratio between an integrated value of the light emission intensity of the LED in the light emission region of the back projection image of the effective light source distribution and an integrated value of the light emission intensity of the LED in the light emission plane of the LED. In other words, the expression (3) corresponds to a value obtained by normalizing the energy that can pass through the aperture diaphragm by using the total light emission energy of the LED. In other words, the expression (3) represents the relative value of the energy that can pass through the aperture diaphragm to the total light emission energy of the LED.

$$\left(\frac{\int_{S'} I(x, y)dS'}{\int_S I(x, y)dS}\right) \quad (3)$$

Accordingly, the expression (1), which is the ratio between the expression (3) and the expression (2), represents the ratio of the amount of light passing through the aperture diaphragm, to the amount of light passing through the aperture diaphragm in a case where the LED of emitting uniform light is used. In other words, it can also be said that the expression (1) represents a gain of the light amount by the modified illumination according to the present exemplary embodiment.

As far as the inventor knows, in a case where a commercialized UV-LED having a substantially uniform in-plane light emission distribution is used, the evaluation value of the expression (1) is 1.12 at the maximum, and a configuration that exceeds the evaluation value of 1.13 cannot be provided. In a case where the plurality of LEDs is included in the light source, the expression (1) is evaluated for each of the LEDs, but the evaluation value of the expression (1) is not necessarily 1.13 or more for all the LEDs. For example, it is sufficient that the average of the evaluation values of the expression (1) for all the LEDs is 1.13 or more.

A method of localizing the light emission distribution of the LED will be described. An anode and a cathode are bonded to the LED. An electric potential difference is applied between the anode and the cathode, so that an electric field is formed inside the LED, and carriers move along the electric field. Electrons and holes, which are the carriers, are recombined in a light emission layer and energy is thereby radiated as light, so that the LED emits the light. The electric field inside the LED is formed starting from the electrode, so that the electric field density is higher, and the light emission intensity is higher, at a portion closer to the electrode. On the other hand, the electric field density is lower, and the light emission intensity is lower, at a portion farther away from the electrode. In general, a current diffusion layer is provided to diffuse carriers in a direction perpendicular to the direction of the electric field, and the above-described tendency is present in such a case as well. In addition, in general, electrodes are formed so that light is uniformly emitted in the plane of an LED. In contrast, in the present exemplary embodiment, a region where light is emitted at a high intensity in part is intentionally provided, and this region is configured to correspond to the light emission region of the modified illumination.

Accordingly, in Example 1, in a case where the light emission distribution and the pupil plane intensity distribution are the same, the above-described light emission distribution of the LED is formed, so that the loss of the light amount of the modified illumination can be reduced.

In Example 1, the case where the light emission distribution and the pupil plane intensity distribution are the same is described. In Example 2, a case where the light emission distribution and the pupil plane intensity distribution are different will be described.

FIGS. 12A, 12B, and 12C are diagrams illustrating a target pupil plane intensity distribution obtained using a plurality of LEDs having different light emission distributions. FIG. 12A illustrates four types of light emission distributions 57a to 57d different from each other. The light emission distributions 57a to 57d all have quadrupole shapes, and the light emission distributions 57b, 57c, and 57d are rotated 22.5 degrees, 45 degrees, and 67.5 degrees, respectively, around a z-axis perpendicular to the light emission planes, relative to the light emission distribution 57a. The light emission planes of the respective light emission distributions 57a to 57d are conjugated with the pupil plane of the illumination optical system, and the respective optical images are superimposed at the pupil plane position.

FIG. 12B illustrates a pupil plane intensity distribution 55 on the pupil plane, and FIG. 12C illustrates an aperture diaphragm 54 having an annular shape. The light emission distributions 57a to 57d in FIG. 12A are designed to form the pupil plane intensity distribution 55 in FIG. 12B, and light is guided to fill a transmissive portion of the aperture diaphragm 54 in the annular shape. After the light transmission through the aperture diaphragm 54 in the annular shape, an effective light source distribution 56 having an annular shape in FIG. 12C is formed. In this way, the optical images of the plurality of LEDs different in light emission distribution are superimposed on the pupil plane, so that the effective light source distribution different from the light emission distribution of each of the LEDs can be formed.

Figure 13C:
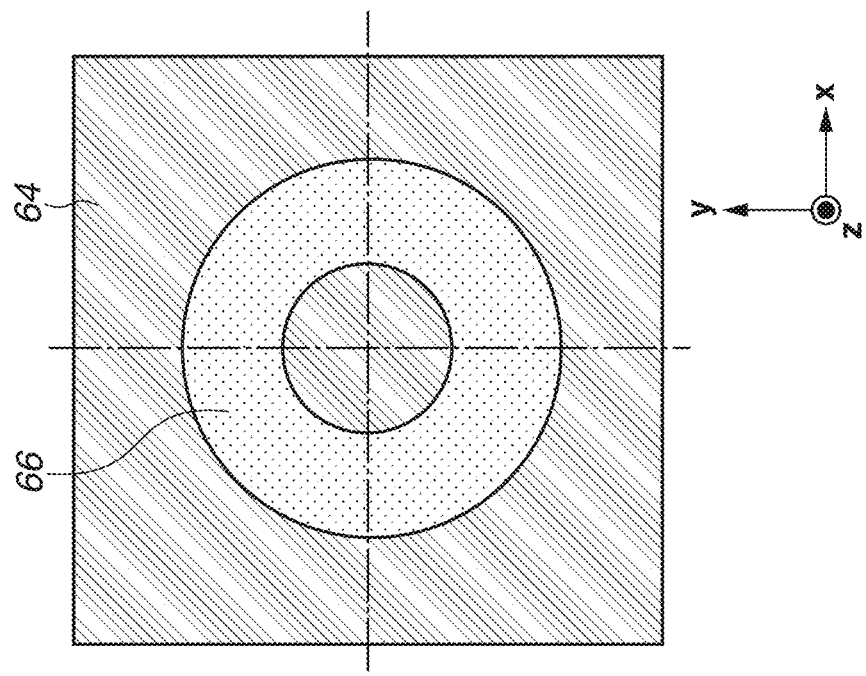
FIGS. 13A, 13B, and 13C are diagrams illustrating formation of annular illumination by a plurality of LEDs different in angle.
Figure 13B:
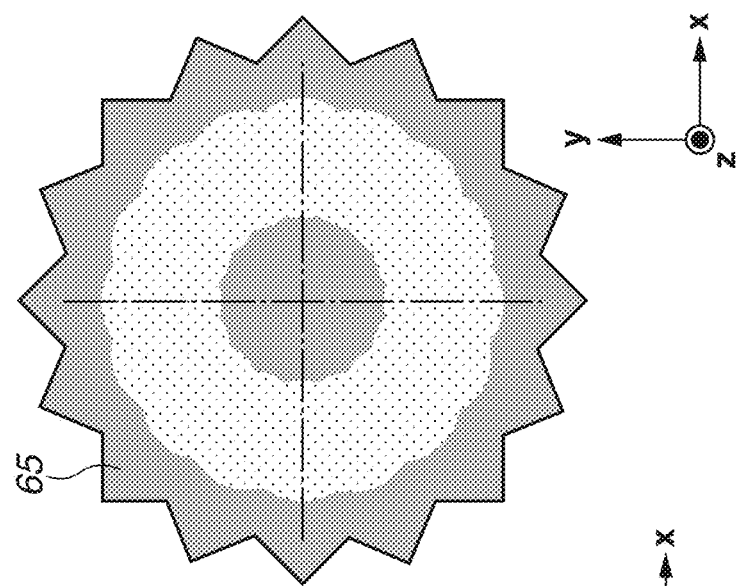
Figure 13A:
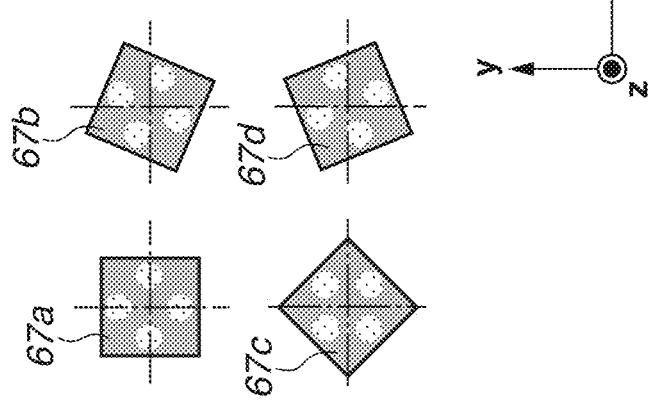

FIGS. 13A, 13B, and 13C are diagrams illustrating a target pupil plane intensity distribution obtained by disposing a plurality of LEDs exhibiting identical light emission distributions in rotated manner around a z-axis perpendicular to the light emission planes. Four light emission distributions 67a to 67d illustrated in FIG. 13A are all identical light emission distributions, but angles at which the LEDs are disposed are different. In such a case as well, the optical images of all the light emission planes are superimposed at the pupil plane position of the illumination optical system, and there is formed a pupil plane intensity distribution 65 in which the maximum light intensity is achieved outside the optical axis of the illumination optical system as illustrated in FIG. 13B. Further, an effective light source distribution 66 having an annular shape is formed by partially blocking the light using an aperture diaphragm 64 having an annular shape. In other words, even if the light emission distributions of the LEDs are the same, the effective light source distribution different from the light emission distributions of the LEDs can be formed by arranging the LEDs in different angles.

FIGS. 14A, 14B, and 14C are diagrams illustrating a target pupil plane intensity distribution obtained by disposing a plurality of LEDs exhibiting identical light emission distributions at positions decentered from an optical axis. Light emission distributions 77a to 77d in FIG. 14A each correspond to the LED with which the maximum light emission intensity is achieved near the center of the LED. However, the LEDs are at the positions different from each other and decentered from the optical axes of the respective collimate lenses included in the light condensing unit 23. More specifically, when a deviation amount of the LED from the optical axis of each of the collimate lenses is d, the LEDs are disposed at four positions (x,y)=(d,0), (−d,0), (0,d), and (0,−d). As a result, a pupil plane intensity distribution 75 having a quadrupole shape is formed on the pupil plane, and an effective light source distribution 76 having a quadrupole shape can be efficiently formed. In this way, the configuration in which the light emission intensity is high at a point deviated from the optical axis of the light condensing unit is provided, so that the loss of the light amount of the modified illumination can be reduced.

In this case, it is not necessary for all the four types of LEDs illustrated in each of FIG. 12A, FIG. 13A, and FIG. 14A to simultaneously emit light, and these LEDs may be individually turned on and off. In addition, the light emission amounts of the respective LEDs do not need to be the same, and may be relatively different. In this way, the symmetry of the effective light source distribution is varied, so that it is also possible to control misorientation of resolving power. For example, the light emission distributions 77b and 77c disposed at (x,y)=(d,0) and (−d,0) are turned on, and the light emission distributions 77a and 77d disposed at (x,y)=(0,d) and (0,−d) are turned off, in FIG. 14A. In such a case, it is possible to greatly improve the resolving power with respect to a line-and-space pattern arranged in an x-direction and having the longitudinal direction in a y-direction.

Conversely, the light emission distributions 77a and 77d disposed at (x,y)=(0,d) and (0,−d) may be turned on, and the light emission distributions 77b and 77c disposed at (x,y)=(d,0) and (−d,0) may be turned off, in FIG. 14A. In such a case, it is possible to greatly improve the resolving power with respect to a line-and-space pattern arranged in the y-direction and having the longitudinal direction in the x-direction.

Accordingly, as in Example 2, even in a case where the light emission distribution and the pupil plane intensity distribution are different, the loss of the light amount of the modified illumination can be reduced by forming the above-described light emission distribution of the LED.

In each of Example 1 and Example 2, the light emission distribution for reducing the loss of the light amount of the modified illumination is described. In Example 3, the illumination optical system 10 has a configuration in which the focal length of the light condensing unit 23 is variable and this configuration will be described.

Figure 15A:
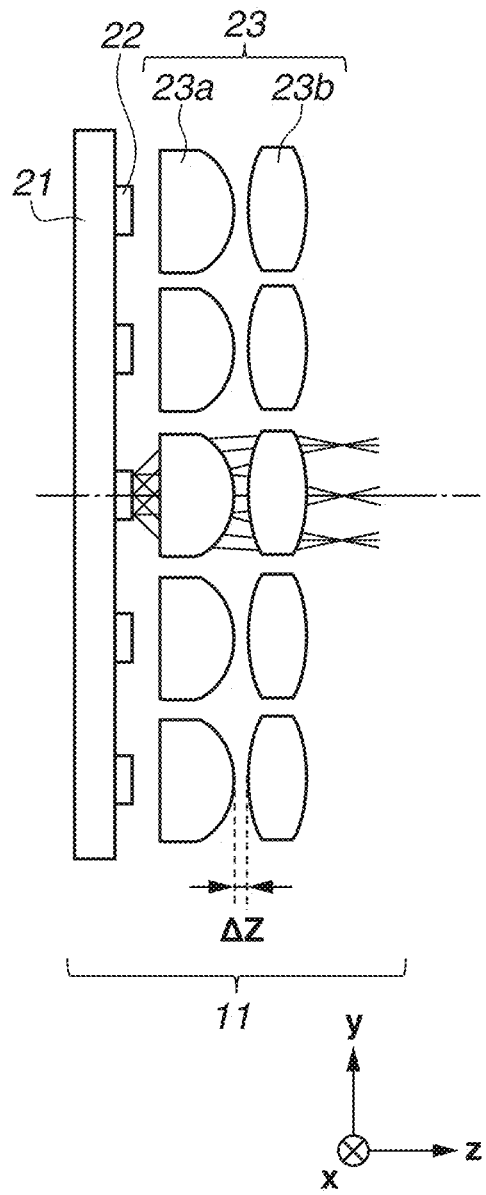
FIGS. 15A and 15B are diagrams illustrating a configuration of a light condensing portion with a variable focal length.
Figure 15B:
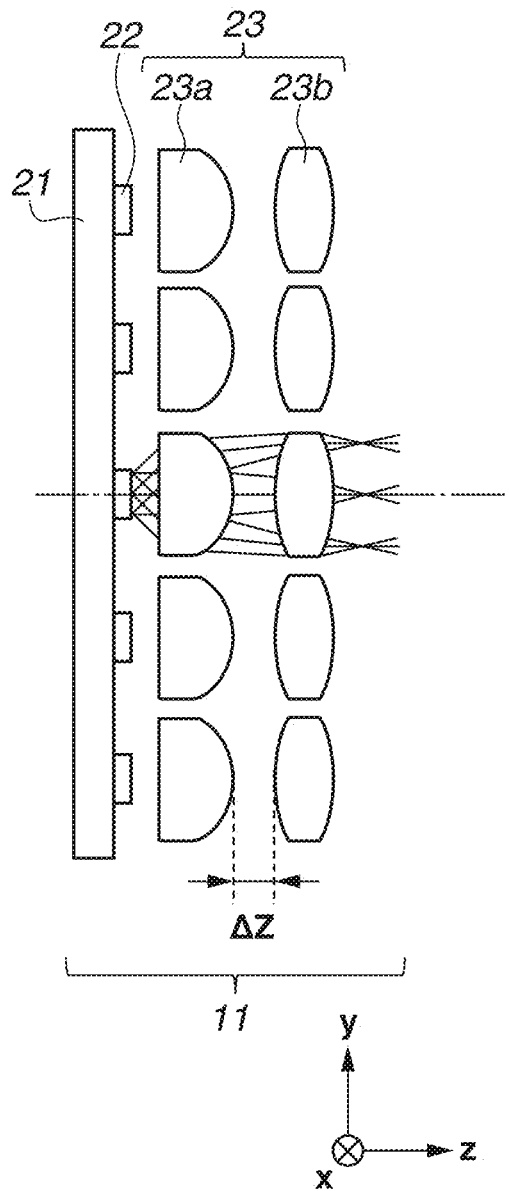

FIGS. 15A and 15B are diagrams illustrating a configuration of the light source (LED array light source) 11. The light condensing unit 23 is composed of two lenses including a collimate lens 23a and a collimate lens 23b, and the collimate lens 23b can be driven along a z-axis. A distance ΔZ between the collimate lens 23a and the collimate lens 23b is variable, and thus the focal length of the light condensing unit 23 is variable. FIG. 15A is a diagram illustrating a configuration in which the distance ΔZ between the collimate lens 23a and the collimate lens 23b is short, and FIG. 15B is a diagram illustrating a configuration in which the distance ΔZ between the collimate lens 23a and the collimate lens 23b is long.

In this case, if a configuration in which the focal length of the light condensing unit 23 is variable is provided, the above-described mechanism is not necessarily provided. For example, a configuration in which three or more collimate lenses are disposed may be provided, and a configuration in which the collimate lens 23a instead of the collimate lens 23b is driven may be provided. In the configuration illustrated in FIGS. 15A and 15B, the larger the distance ΔZ between the collimate lens 23a and the collimate lens 23b is, the longer the focal length is, and thus the focal length of the light condensing unit 23 in FIG. 15B is long compared with the focal length of the light condensing unit 23 in FIG. 15A.

Figure 16A:
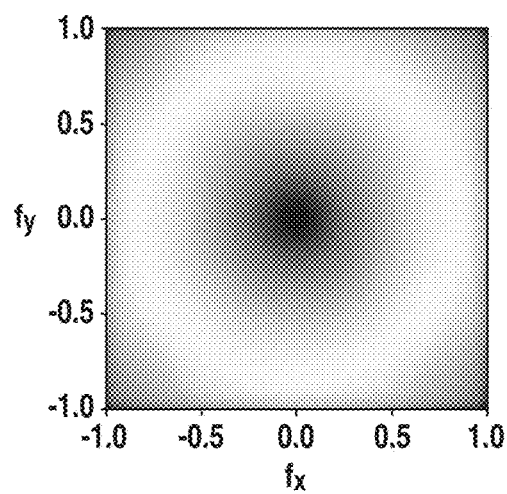
FIGS. 16A and 16B are diagrams illustrating a simulation result of a pupil plane intensity distribution.
Figure 16B:
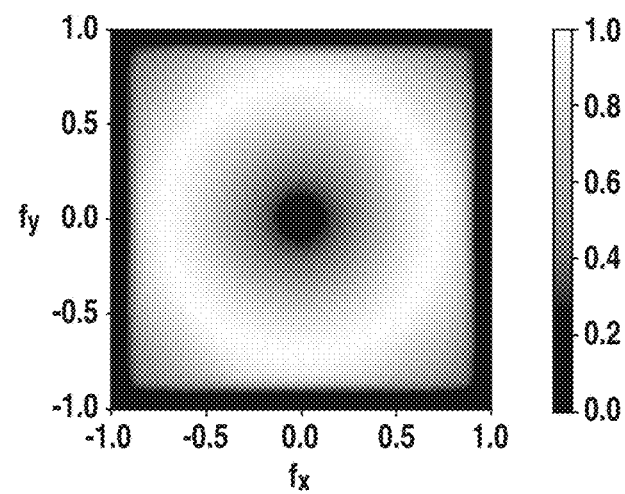

Next, an effect obtained by having the variable focal length will be described. FIGS. 16A and 16B are diagrams illustrating an effect on the pupil plane intensity distribution due to the difference in the distance ΔZ between the collimate lens 23a and the collimate lens 23b. FIG. 16A illustrates a pupil plane intensity distribution in a case of ΔZ=1 mm, and FIG. 16B illustrates a pupil plane intensity distribution in a case of ΔZ=3 mm. In other words, FIG. 16A is a diagram corresponding to FIG. 15A illustrating the case where the distance ΔZ is short, and FIG. 16B is a diagram corresponding to FIG. 15B illustrating the case where the distance ΔZ is long. In this case, the focal length of the light condensing unit 23 is 6.56 mm in FIG. 16A, and 7.24 mm in FIG. 16B. For the axis of the pupil plane intensity distribution, values obtained by normalizing the angle distribution of the light emitted from the light condensing unit with a numerical aperture NA of the projection optical system are represented by a horizontal axis fx and a vertical axis fy. In addition, vertical gradations are both normalized with the maximum value in FIG. 16B.

Figure 17:
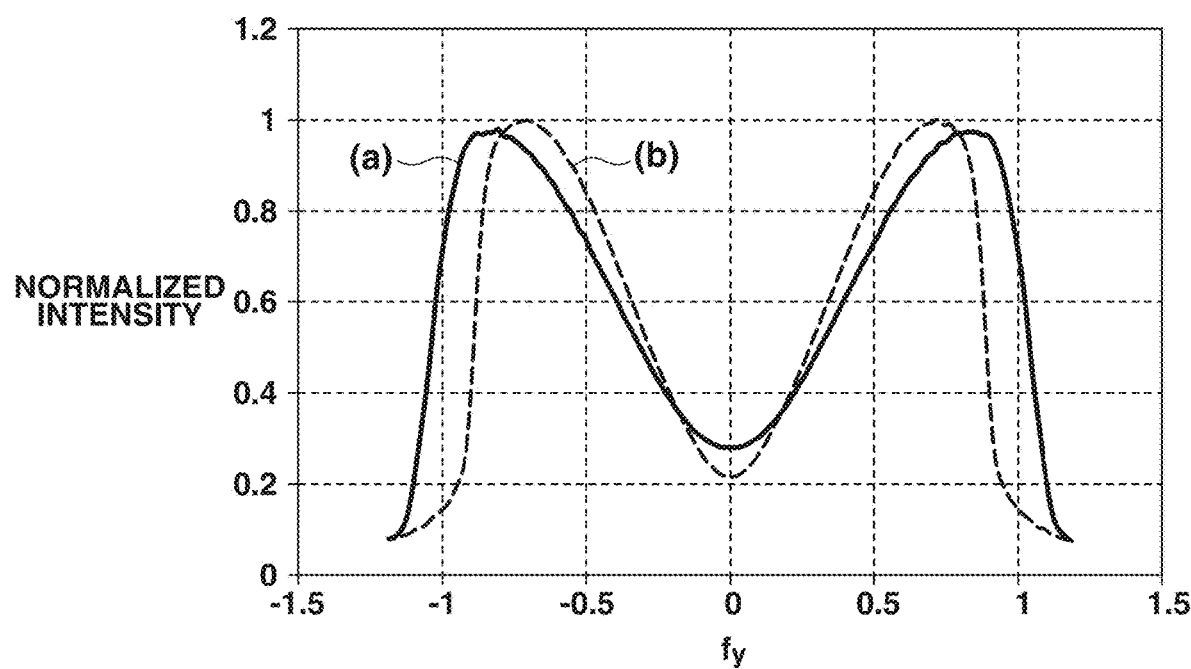
FIG. 17 is a diagram illustrating intensity profiles of the pupil plane intensity distributions for those in FIGS. 16A and 16B.

In FIG. 16B in which the focal length is long, the extent of the distribution is small, and σ of a region exhibiting a high light intensity is small, compared with FIG. 16A. FIG. 17 is a graph illustrating an intensity profile of fy, assuming fx=0 in each of FIG. 16A and FIG. 16B. As with FIGS. 16A and 16B, the vertical axis is normalized with the maximum value of B. As illustrated in FIG. 17, σ taking the maximum value in FIG. 16B is smaller than in FIG. 16A by 0.12. In other words, a light intensity distribution localized on the inner side from the optical axis as the center is obtained. In this way, the illumination optical system 10 has the configuration in which the focal length is variable is provided in Example 3, and thus a pupil plane intensity distribution achieving a target extent can be obtained. Accordingly, the pupil plane intensity distribution can be controlled to reduce the loss of the light amount of the modified illumination, by making the focal length variable. In addition, a suitable effective light source distribution changes depending on a mask pattern, and thus the variability of the pupil plane intensity distribution produces the effect of being capable of supporting a wide range of processes.

In Example 1 to Example 3, it is premised that the LED has only one light emission distribution. However, depending on how to dispose the electrodes of the LED, one LED can have two or more light emission distributions. An example in which one LED has two light emission distributions will be described in Example 4.

Figure 18:
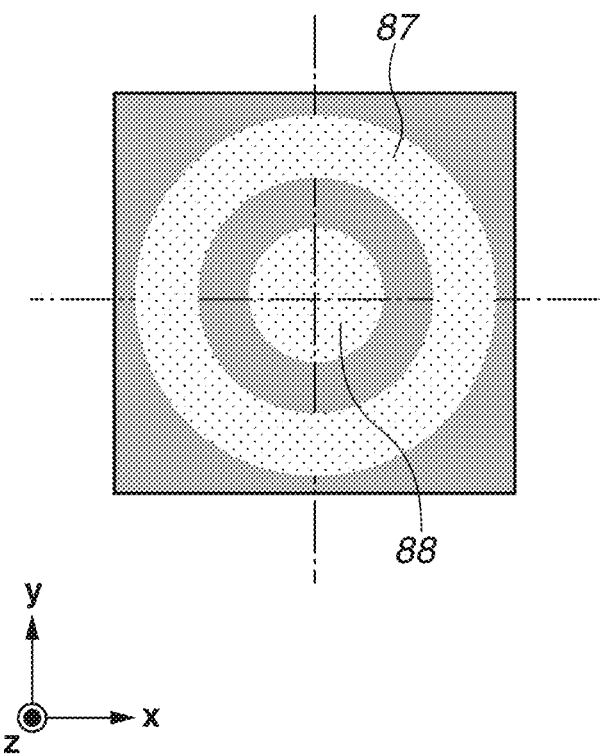
FIG. 18 is a diagram illustrating a light emission plane of a plurality of light emission distributions.

FIG. 18 illustrates a light emission distribution of a light emission plane of an LED having an annular light emission region 87 and a circular light emission region 88. The annular light emission region 87 is implemented by disposing an electrode in the shape of a ring on the surface of the LED. The circular light emission region 88 is implemented by disposing an electrode in the shape of a circle on the surface of the LED. The electrodes are wired not to be in contact with each other, so that turning on/off for each of the regions can be individually controlled. In this way, the plurality of light emission distributions is provided for the one LED and turning on/off is individually controlled, so that the capability to support a wide range of processes can be obtained. The way of providing the plurality of light emission regions described above is only an example, and, for example, a grid of a plurality of spot-shaped light emission regions may be provided.

As a result, in Example 4, because the two or more light emission distributions can be provided for the one LED, the loss of the light amount of the modified illumination in various shapes can be reduced.

In Example 1 to Example 4, the wavelength of the light emitted from the LED is not considered. In Example 5, an example of forming modified illumination in which a region is considered based on light of a plurality of wavelength characteristics will be described. An effective light source distribution varying depending on the wavelength characteristic is formed using the light of a plurality of wavelength characteristics as a light source, so that it can be expected to obtain high resolving performance.

Figure 19:
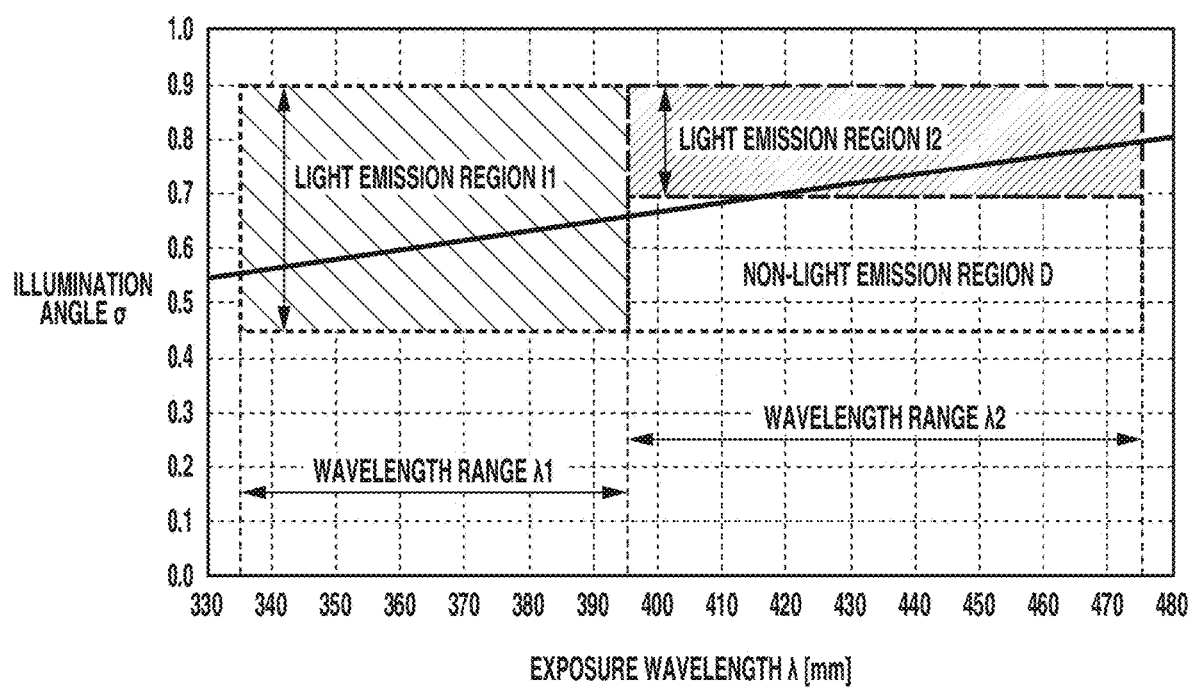
FIG. 19 is a graph illustrating a relationship between a wavelength range and a light emission region of modified illumination according to Example 5.

FIG. 19 is a diagram illustrating a relationship between an exposure wavelength λ and an illumination angle $\sigma_c$ for obtaining high resolving performance.

In this case, where a numerical aperture of a projection optical system is NA when a pattern having a cycle period of P is exposed with the exposure wavelength λ, the illumination angle $\sigma_c$ is determined by the following expression (4).

$$\sigma_c = \lambda/(2NA \cdot P) \quad (4)$$

The modified illumination is performed using a light emission region including the determined illumination angle $\sigma_c$, so that a decrease in contrast cause by defocusing can be suppressed. Since the illumination angle $\sigma_c$ depends on the wavelength λ in the expression (4), it can be said that the effective light source distribution contributing to an improvement in the resolving performance varies depending on the exposure wavelength. FIG. 19 illustrates the relationship between the exposure wavelength λ and the illumination angle $\sigma_c$ of the expression (4), using a solid line. As illustrated in FIG. 19, an improvement in the resolving performance can be expected by proving the effective light source distribution indicated by a light emission region I1 in a wavelength range λ1 and the effective light source distribution indicated by a light emission region I2 in a wavelength range λ2.

FIG. 20 illustrates a result of performing simulation as to an effect obtained in a case where the region is considered based on the light of the plurality of wavelength characteristics. The simulation is performed for the resolving performance of a line-and-space pattern of 1.5 μm, using two types of LEDs, specifically, an LED having a wavelength characteristic with a peak wavelength of 365 nm and an LED having a wavelength characteristic with a peak wavelength of 405 nm, as a light source. The numerical aperture NA is 0.10. The modified illumination according to Example 5 is the combination of an annular effective light source distribution of σ=0.45-0.90 formed with the light of 365 nm, and an annular effective light source distribution of σ=0.70-0.90 formed with the light of 405 nm.

A second comparative example in which both of 365 nm and 405 nm are conditions for forming the annular effective light source distribution of σ=0.45-0.90 is also evaluated as a comparative example of Example 5. A depth of focus (DOF) is defined as a focus width at which the bottom critical dimension of a resist image fluctuates 10% with respect to 1.5 μm, which is a target critical dimension. In Example 5, contrast and DOF have both improved, as compared with the second comparative example. The contrast described below is aerial image intensity contrast of a resist, and an improvement in contrast means an improvement in resolving power.

In Example 5, the light amount of 405 nm light is small, and thus the centroid wavelength of exposure light is short, compared with the annular illumination of the second comparative example. Usually, if the wavelength of exposure light is reduced, contrast improves, but DOF becomes small. In this way, in general, contrast and DOF are in trade-off relationship, but in Example 5, the trade-off is removed and the contrast and the DOF can be simultaneously improved, and thus Example 5 is superior to the second comparative example.

As one of the methods of forming the modified illumination in Example 5, there is a method of inserting a wavelength filter at the pupil plane position of the illumination optical system, to block the light in a that unnecessary wavelength range and an unnecessary light emission region. In this case, the loss of a light amount corresponding to the unnecessary wavelength range and unnecessary light emission region occurs. For example, in a case where the modified illumination of Example 5 is formed, the light of 365 nm is blocked in the region of σ=0.00-0.45, and the light of 405 nm is blocked in the region of σ=0.00-0.70. In a case where an LED having a uniform light emission distribution is used as the light source, the pupil plane intensity distribution is also uniform, and thus the loss of the light amount corresponding to the unnecessary wavelength range and unnecessary light emission region occurs. To address such an issue, a technique for reducing the loss of the light amount in forming the effective light source distribution varying depending on the wavelength range, will be described below.

The illumination optical system 10 illustrated in FIG. 4 is an example of an illumination optical system for reducing the loss of the light amount. The illumination optical system 10 includes the light source (LED array light source) 11a including the plurality of first LEDs having the first wavelength characteristic λ1, and the light source (LED array light source) 11b including the plurality of second LEDs having the second wavelength characteristic λ2, as the light source. All or most (e.g., 90% or more) of the light emission planes of the plurality of first LEDs and the plurality of second LEDs are optically conjugated with the incident plane of the optical integrator 13. Thus, in order to efficiently form the effective light source distribution varying depending on the wavelength, optical configurations that differ by using LEDs different in emission wavelength may be provided.

Figure 21A:
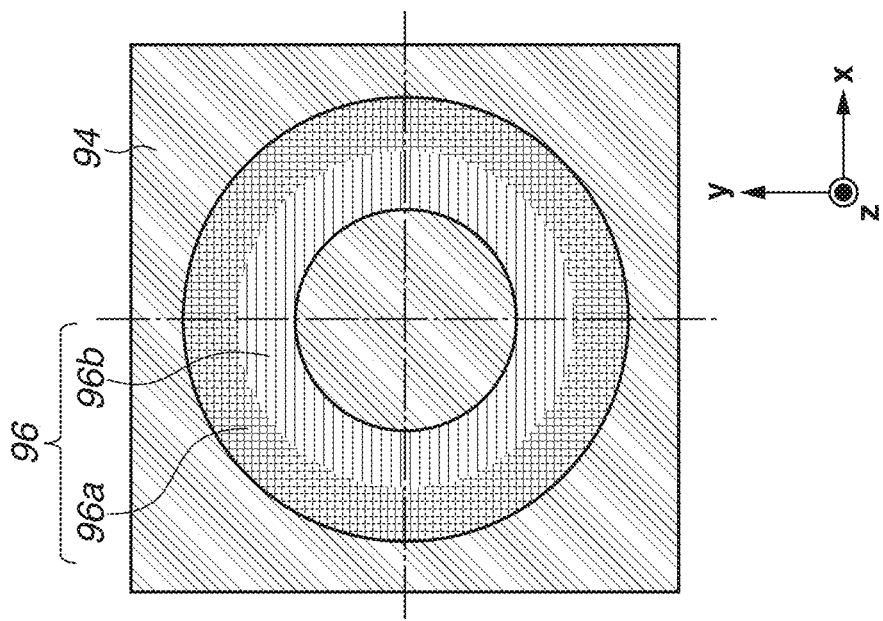
FIGS. 21A, 21B, and 21C are diagrams illustrating formation of an effective light source distribution according to Example 5.
Figure 21B:
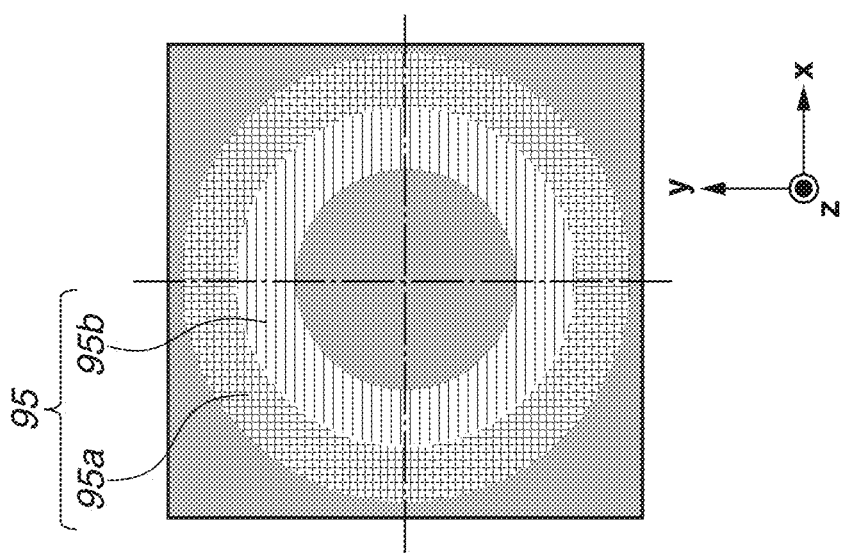
Figure 21C:
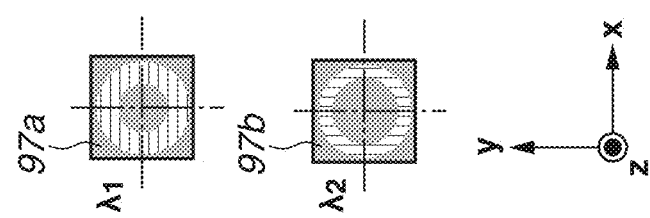

A specific example for efficiently forming the modified illumination of Example 5 will be described with reference to FIGS. 21A to 21C. FIG. 21A illustrates the light emission distributions of the LEDs in Example 5. A region of a light emission distribution 97a of the first LED having the first wavelength characteristic λ1 is the light emission region of the first LED. A region of a light emission distribution 97b of the second LED having the second wavelength characteristic λ2 is the light emission region of the second LED. FIG. 21B illustrates the pupil plane intensity distribution. The light emission plane of the first LED and the light emission plane of the second LED are both optically conjugated with the pupil plane of the illumination optical system. Thus, the pupil plane intensity distribution is a pupil plane intensity distribution 95 obtained by combining a light emission region 95a including the light of the wavelength characteristics λ1 and λ2 and a light emission region 95b including the light of the wavelength characteristic λ1. FIG. 21C illustrates an aperture diaphragm 94 and an effective light source distribution 96. The effective light source distribution 96 varying depending on wavelength is formed, After the light transmission through the aperture diaphragm 94 in an annular shape illustrated in FIG. 21C.

In this way, the light emission distribution 97a of the first LED and the light emission distribution 97b of the second LED are varied, thereby making it possible to form the effective light source distribution varying depending on the wavelength on the pupil plane, without using a wavelength filter. A larger amount of light can be guided to the mask, than in a case where a substantially uniform pupil plane intensity distribution is formed using an LED having a uniform light emission distribution, and light in unnecessary wavelength range and unnecessary light emission region is blocked by a wavelength filter.

The aperture diaphragm 94 is illustrated in FIG. 21C, but the aperture diaphragm is not necessarily required. In addition, actually, the boundary between a light emission region 96a and a light emission region 96b is not discrete. This is because the light emission distribution of an actual LED is not discrete unlike the light emission distribution illustrated in FIG. 21A, and the optical image of the LED blurs on the pupil plane under the influence of the aberration of the optical system and projected. To make the boundary between the light emission regions 95a and 95b clear, a wavelength filter may be inserted in place of the aperture diaphragm 94.

The example of making the light emission distributions vary depending on the emission wavelength of the LED is described above, but the different light emission distributions are not necessarily required, which will be described below. As described in Example 3, the different effective light source distributions can be formed by varying the focal lengths of the light condensing unit 23. Example 3 and Example 5 are combined to set the focal length so as to form the pupil plane intensity distribution in FIG. 16A, for example, for the light condensing unit 23 corresponding to the first LED having the first wavelength characteristic λ1. Further, the focal length is set so as to form the pupil plane intensity distribution in FIG. 16B, for the light condensing unit 23 corresponding to the second LED having the second wavelength characteristic λ2. These are superimposed, so that the effective light source distributions varying depending on wavelength can be formed.

According to the expression (4), $\sigma_c$ that is the illumination condition suitable for reducing a decrease in contrast cause by defocusing is proportional to the exposure wavelength λ. This means that the illumination angle of a mask suitable for the exposure light of a long wavelength is greater than the illumination angle of a mask suitable for the exposure light of a short wavelength. When re-expressed from the viewpoint of the light amount distribution on the pupil, it is desirable to provide a distribution in which the effective light source distribution of the light of the long wavelength is localized at a position further outward than the effective light source distribution of the light of the short wavelength, with the illumination optical system 10 as the center. When quantitatively expressed, this can be represented by the following expression (5).

$$\int_S \{I(f_x,f_y) \times \sqrt{f_x^2+f_y^2}\} dS / \int_S I(f_x,f_y) dS \qquad (5)$$

Figure 22:
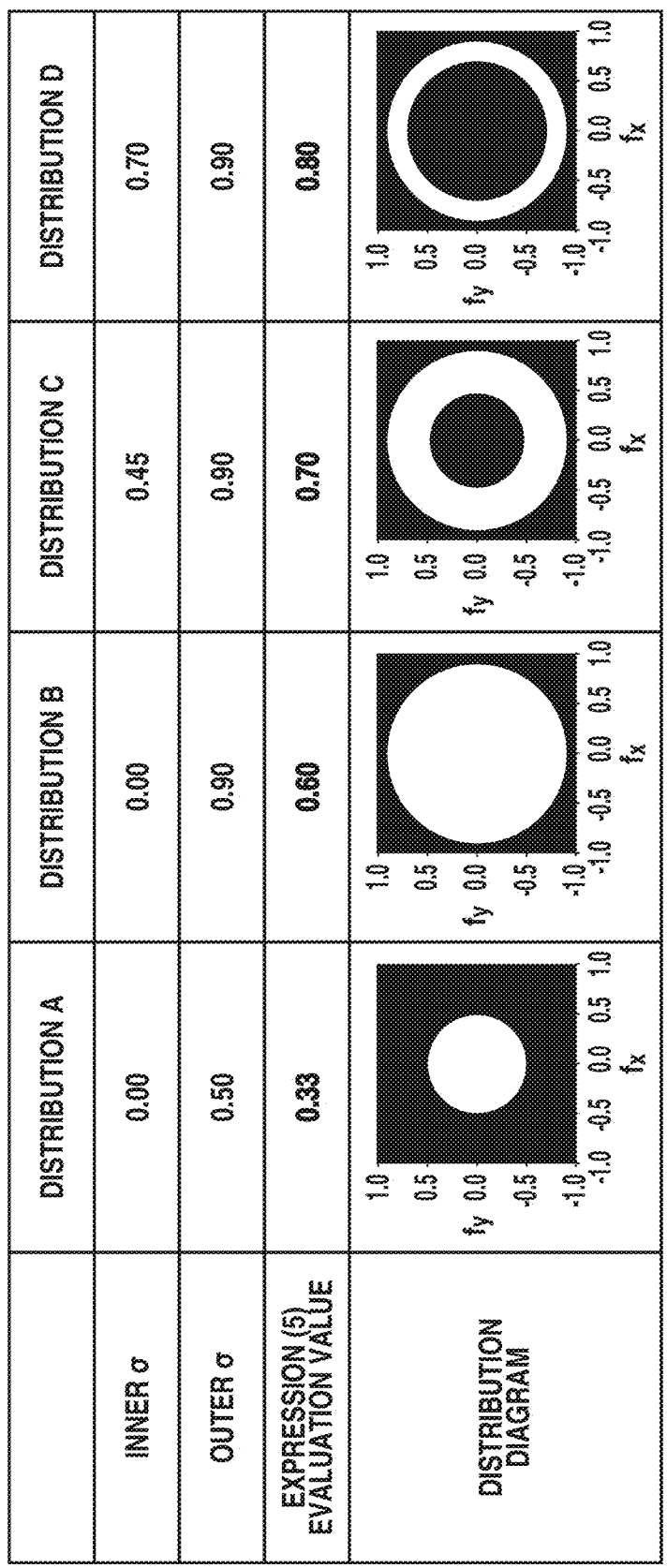
FIG. 22 is a table illustrating correspondences between various distributions and evaluation values of an expression (5).

In the expression (5), "fx,fy" are coordinates on the pupil plane, "S" is a region where the effective light source distribution is formed on the pupil plane, "I(fx,fy)" is an illuminance distribution (light amount distribution per unit area) of the effective light source distribution, and "dS" is a minute area element. A numerical value is obtained by multiplying a light amount at a certain point by a distance from the center of the point and calculating the sum, and the numerical value is divided by the total light amount to obtain a value represented by the expression (5). The further outward from the illumination optical system 10 as the center the distribution is localized, the greater the obtained value is. FIG. 22 illustrates the result of evaluating the expression (5) with respect to four types of distributions A to D. The light intensities are all assumed to be 1.

The distribution A and the distribution B are a circular distribution of σ=0.00-0.50 and a circular distribution of σ=0.00-0.90, respectively, and the distribution C and the distribution D are an annular distribution of σ=0.45-0.90 and an annular distribution of σ=0.70-0.90, respectively. In FIG. 22, "inner σ" represents the minimum value of σ, and "outer σ" represents the maximum value of σ. These are distributions located further outward from the illumination optical system 10 as the center, in order of the distribution A, the distribution B, the distribution C, and the distribution D, and the evaluation value of the expression (5) also increases in this order.

The evaluation value of the expression (5) in the effective light source distribution of the first wavelength characteristic λ1 is assumed to be V1, and the evaluation value of the expression (5) in the effective light source distribution of the second wavelength characteristic λ2 is assumed to be V2. Further, the centroid wavelength of the second wavelength characteristic λ2 is assumed to be a long wavelength when the centroid wavelength of the first wavelength characteristic λ1 and the centroid wavelength of the second wavelength characteristic λ2 are compared. The effective light source distribution in which V2 is greater than V1 is appropriate to the condition of the expression (4), and thus the effect of improving the resolving performance for a line-and-space pattern can be obtained. In this case, when the light emission light amount of the light source for the wavelength λ is assumed to be I(λ), the centroid wavelength refers to a wavelength calculated by the following expression (6).

$$\int \{I(\lambda) \times \lambda\} d\lambda / \int I(\lambda) d\lambda \qquad (6)$$

In Example 5, in a case where the modified illumination forms an appropriate effective light source distribution for each of a plurality of wavelength ranges, this can also reduce the loss of the light amount. Therefore, it is also possible to expect the effect of improving the performance in terms of contrast and DOF, while reducing the loss of the light amount.

<Manufacturing Method of Article>

Next, an article (e.g., a flat-panel display, a liquid crystal display device, a semiconductor integrated circuit (IC) device, MEMS) manufacturing method using the above-described exposure apparatus, will be described. The article manufacturing method includes forming a latent image pattern on a photoresist applied onto a plate using the above-described exposure apparatus (exposing a plate), and developing the plate on which the latent image pattern is formed. The article manufacturing method further includes performing other known processes such as oxidation, film formation, deposition, doping, flattening, etching, resist removing, dicing, bonding, and packaging. The article manufacturing method of the present exemplary embodiment is more advantageous in at least one of the performance, quality, productivity, and production cost of the article than a conventional method.

The exemplary embodiments of the present invention are described above, but the present invention is not limited to these exemplary embodiments, and various alterations and modifications can be made within the gist thereof. For example, the present invention is also applicable to multiple exposure. Moreover, the modified illumination of the present invention may be applied to a maskless exposure apparatus.

According to the exemplary embodiments of the present invention, for example, it is possible to provide an exposure apparatus that is advantageous for reducing a decrease in illuminance in modified illumination using an LED as a light source.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-097739, filed Jun. 4, 2020, which is hereby incorporated by reference herein in its entirety.

What is claimed is:

1. An exposure apparatus configured to expose a substrate, the exposure apparatus comprising:
   an illumination optical system including:
      a first solid-state light emitting element;
      a second solid-state light emitting element;
      a first collimate lens through which light from the first solid-state light emitting element passes, the first collimate lens having an optical axis;
      a second collimate lens through which light from the second solid-state light emitting element passes, the second collimate lens having an optical axis; and
      a condenser lens configured to condense light having passed through the first and second collimate lenses, the illumination optical system being configured to illuminate a mask with light from the first and second solid-state light emitting elements; and
   a projection optical system configured to project an image of a pattern of the mask onto the substrate,
   wherein the first solid-state light emitting element is oriented about the optical axis of the first collimate lens at a first angle of rotation,
   wherein the second solid-state light emitting element is oriented about the optical axis of the second collimate lens at a second angle of rotation,
   wherein the first angle of rotation is different from the second angle of rotation,
   wherein the first solid-state light emitting element emits light such that a maximum intensity is achieved outside the optical axis of the first collimate lens and the second solid-state light emitting element emits light such that maximum intensity is achieved outside the optical axis of the second collimate lens,
   wherein a pupil plane intensity distribution near a rear focal position of the condenser lens is a light intensity distribution formed by superimposing light from the first solid-state light emitting elements and second solid-state light emitting elements, so that the optical axis of the first collimate lens and the optical axis of the second collimate lens coincide with an optical axis of the condenser lens, and
   wherein the pupil plane intensity distribution is a light intensity distribution having a maximum intensity outside an optical axis of the illumination optical system.

2. The exposure apparatus according to claim 1, wherein the pupil plane intensity distribution includes a light intensity distribution with fourfold-or-more rotational symmetry.

3. The exposure apparatus according to claim 2, wherein the pupil plane intensity distribution includes an annular light intensity distribution.

4. The exposure apparatus according to claim 2, wherein the pupil plane intensity distribution includes a quadrupole light intensity distribution.

5. The exposure apparatus according to claim 1, wherein the illumination optical system further includes an aperture diaphragm that blocks a part of the light.

6. The exposure apparatus according to claim 5, wherein the light emission distribution includes a distribution corresponding to an effective light source distribution that is a light intensity distribution on a pupil plane of the illumination optical system after light transmission through the aperture diaphragm.

7. The exposure apparatus according to claim 6, wherein a region where a maximum light intensity is achieved in a light emission distribution of the first and the second solid-state light emitting elements is included in a region formed by virtually back-projecting a light emission region of the effective light source distribution onto the light emission plane.

8. The exposure apparatus according to claim 7, wherein a characteristic value of 1.13 or more is defined in the following expression:

$$\left(\frac{\int_{S'} I(x,y)dS'}{\int_S I(x,y)dS}\right) \Big/ \left(\frac{\int_{S'} dS'}{\int_S dS}\right)$$

where S is the region of the light emission distribution, S' is the region of the back-projected distribution, and I(x,y) is an illuminance distribution on the light emission plane of the solid-state light emitting element.

9. The exposure apparatus according to claim 1, wherein a rear focal position of each of the first and second collimate lenses corresponds to a front focal position of the condenser lens, and a rear focal position of the condenser lens corresponds to a pupil plane of the illumination optical system.

10. The exposure apparatus according to claim 9, wherein the first solid-state light emitting element is decentered from the optical axis of the first collimate lens and the second solid-state light emitting element is decentered from the optical axis of the second collimate lens.

11. The exposure apparatus according to claim 9, wherein a focal length of the light condensing unit is variable.

12. The exposure apparatus according to claim 1, wherein the light emission distribution of the first solid-state light emitting element includes a light emission distribution different from the light emission distribution of the second solid-state light emitting element.

13. The exposure apparatus according to claim 1, further comprising an optical integrator,
wherein the optical integrator is arranged such that a light emission plane of each of the first and second solid-state light emitting elements is optically conjugated with an incident plane of the optical integrator.

14. An exposure apparatus configured expose a substrate, the exposure apparatus comprising:
an illumination optical system including:
a first solid-state light emitting element having a first wavelength characteristic;
a second solid-state light emitting element having a second wavelength characteristic different from the first wavelength characteristic;
a first collimate lens through which light from the first solid-state light emitting element passes, the first collimate lens having an optical axis;
a second collimate lens through which light from the second solid-state light emitting element passes, the second collimate lens having an optical axis; and
a condenser lens configured to condense light having passed through the first and second collimate lenses, the illumination optical system being configured to illuminate a mask with light from the first and second solid-state light emitting elements; and
a projection optical system configured to project an image of a pattern of the mask onto the substrate,
wherein the first solid-state light emitting element is oriented about an axis perpendicular to the light emission plane at a first angle,
wherein the second solid-state light emitting element is oriented about the axis perpendicular to the light emission plane at a second angle,
wherein the first angle is different from the second angle,
wherein the first solid-state light emitting element emits light such that a maximum intensity is achieved outside the optical axis of the first collimate lens and the second solid-state light emitting element emits light such that maximum intensity is achieved outside the optical axis of the second collimate lens,
wherein a pupil plane intensity distribution near a rear focal position of the condenser lens is a light intensity distribution formed by superimposing light from the first and second solid-state light emitting elements, so that the optical axis of the first collimate lens and the optical axis of the second collimate lens coincide with an optical axis of the condenser lens, and
wherein the pupil plane intensity distribution is a light intensity distribution having a maximum intensity outside an optical axis of the illumination optical system.

15. The exposure apparatus according to claim 14, wherein a centroid wavelength of the second wavelength characteristic is longer than a centroid wavelength of the first wavelength characteristic.

16. The exposure apparatus according to claim 15, wherein a region where a maximum light intensity is achieved in the light emission distribution of the second solid-state light emitting element is a region further outward from an optical axis than a region where a maximum light intensity is achieved in the light emission distribution of the first solid-state light emitting element.

17. The exposure apparatus according to claim 15, wherein the first collimate lens is configured to collimate the light from the first solid-state light emitting element and the second collimate lens is configured to collimate the light from the second solid-state light emitting element,
wherein a focal length of the first collimate lens is different from a focal length of the second collimate lens.

18. The exposure apparatus according to claim 15, further comprising an optical integrator,
wherein the optical integrator is arranged such that a light emission plane of each of the first and second solid-state light emitting elements is optically conjugated with an incident plane of the optical integrator.

19. An exposure method of exposing a substrate, the exposure method comprising:
illuminating a mask with an illumination optical system which includes:
a first solid-state light emitting element;
a second solid-state light emitting element;
a first collimate lens through which light from the first solid-state light emitting element passes, the first collimate lens having an optical axis;
a second collimate lens through which light from the second solid-state light emitting element passes, the second collimate lens having an optical axis; and
a condenser lens configured to condense light having passed through the first and second collimate lenses; and
projecting an image of a pattern of the mask onto the substrate,
wherein the first solid-state light emitting element is oriented about an axis perpendicular to the light emission plane at a first angle,
wherein the second solid-state light emitting element is oriented about the axis perpendicular to the light emission plane at a second angle,
wherein the first angle is different from the second angle,
wherein the first solid-state light emitting element emits light such that a maximum intensity is achieved outside the optical axis of the first collimate lens and the second solid-state light emitting element emits light such that maximum intensity is achieved outside the optical axis of the second collimate lens,
wherein a pupil plane intensity distribution near a rear focal position of the condenser lens is a light intensity distribution formed by superimposing light from the first and second solid-state light emitting elements, so that the optical axis of the first collimate lens and the optical axis of the second collimate lens coincide with an optical axis of the condenser lens, and wherein the pupil plane intensity distribution is a light intensity distribution having a maximum intensity outside an optical axis of the illumination optical system.

20. An article manufacturing method, comprising:
exposing a substrate using an exposure apparatus;
developing the exposed substrate; and
subjecting the developed substrate to at least one process among processes including oxidation, film formation, deposition, doping, flattening, etching, resist removing, dicing, bonding, and packaging,
wherein an article is manufactured from the substrate subjected to the process,
wherein the exposure apparatus includes an illumination optical system including:
  a first solid-state light emitting element having a first wavelength characteristic;
  a second solid-state light emitting element having a second wavelength characteristic different from the first wavelength characteristic;
  a first collimate lens through which light from the first solid-state light emitting element passes, the first collimate lens having an optical axis;
  a second collimate lens through which light from the second solid-state light emitting element passes, the second collimate lens having an optical axis; and
  a condenser lens configured to condense light having passed through the first and second collimate lenses, the illumination optical system being configured to illuminate a mask with the light from the first and second solid-state light emitting elements; and
  a projection optical system configured to project an image of a pattern of the mask onto the substrate,
wherein the first solid-state light emitting element is oriented about an axis perpendicular to the light emission plane at a first angle,
wherein the second solid-state light emitting element is oriented about the axis perpendicular to the light emission plane at a second angle,
wherein the first angle is different from the second angle,
wherein the first solid-state light emitting element emits light such that a maximum intensity is achieved outside the optical axis of the first collimate lens and the second solid-state light emitting element emits light such that maximum intensity is achieved outside the optical axis of the second collimate lens,
wherein a pupil plane intensity distribution near a rear focal position of the condenser lens is a light intensity distribution formed by superimposing light from the first and second solid-state light emitting elements, so that the optical axis of the first collimate lens and the optical axis of the second collimate lens coincide with an optical axis of the condenser lens, and
wherein the pupil plane intensity distribution is a light intensity distribution having a maximum intensity outside an optical axis of the illumination optical system.

* * * * *